(12) United States Patent
Formon et al.

(10) Patent No.: US 7,845,593 B2
(45) Date of Patent: *Dec. 7, 2010

(54) APPARATUS AND METHODS USABLE IN CONNECTION WITH DISPENSING FLEXIBLE SHEET MATERIAL FROM A ROLL

(75) Inventors: John S. Formon, Orange Park, FL (US); Andrew R. Morris, Green Cove Springs, FL (US); Michael A. Susi, Marlborough, MA (US); David Gahris, Auburn, ME (US)

(73) Assignee: Georgia-Pacific Consumer Products LP, Atlanta, GA (US)

(*) Notice: Subject to any disclaimer, the term of this patent is extended or adjusted under 35 U.S.C. 154(b) by 204 days.
This patent is subject to a terminal disclaimer.

(21) Appl. No.: 11/953,116

(22) Filed: Dec. 10, 2007

(65) Prior Publication Data
US 2008/0087758 A1  Apr. 17, 2008

Related U.S. Application Data

(62) Division of application No. 10/092,350, filed on Mar. 7, 2002, now Pat. No. 7,341,170.

(51) Int. Cl.
*B65H 19/00* (2006.01)

(52) U.S. Cl. ................. 242/560.1; 242/563; 242/563.2; 242/564.1

(58) Field of Classification Search ................. 242/560, 242/560.1, 560.3, 563, 563.2, 564.1, 564.4; 312/34.22
See application file for complete search history.

(56) References Cited

U.S. PATENT DOCUMENTS 2,193,759 A    3/1940  Birr (Continued)

FOREIGN PATENT DOCUMENTS

DE         3342921 A1   6/1985

(Continued)

OTHER PUBLICATIONS

International Search Report and Written Opinion of the International Searching Authority of PCT/US2002/006833, dated Jul. 30, 2002.

(Continued)

*Primary Examiner*—William A Rivera
(74) *Attorney, Agent, or Firm*—Joel T. Charlton

(57) ABSTRACT

A powered dispenser for dispensing individual sheet segments from a continuous roll of sheet material provided with spaced tear lines comprises a powered feed mechanism, a releasable, powered drive mechanism, a powered transfer mechanism, a pair of web sensing sensors, a capacitive sensing system providing automatic sensitivity adjustment, and control circuitry. A dual power supply system provides a mechanical lock-out functionality, and the control system is protected from electrostatic build-up on the surface of the feed roller. The web sensor, and an antenna plate of the capacitive sensing system, are provided on respective printed circuit boards mounted in overlying relation. Utilizing signals received from the pair of web sensors and the capacitive sensing system, the control circuitry senses the presence of a user to activate the powered drive mechanism, and prevents further dispensing of the sheet material until a previously dispensed segment is separated from the roll. The web sensors detection of a leading edge of the sheet material initiates a predetermined interval of sheet material advancement providing a proper placement of successive tear lines. Various approaches may be utilized to accommodate inadvertent sheet "tabbing" scenarios. The web sensors, together with the control circuitry, are also used to detect the depletion, or absence, of a working roll of sheet material, whereupon the control circuitry controls the powered transfer mechanism to automatically transfer the web feed supply from a depleted working roll to a reserve roll. The powered transfer mechanism may include a motor driven transfer bar, or provide motor driven release of a spring biased transfer bar. Another arrangement allows for ready release of a roll core, and drop of the same into an open dispenser cover for removal.

10 Claims, 21 Drawing Sheets

U.S. PATENT DOCUMENTS

| | | |
|---|---|---|
| 2,299,301 A | 10/1942 | Britt et al. |
| 2,839,345 A | 6/1958 | Engel et al. |
| 2,859,814 A | 11/1958 | Berney |
| 2,930,663 A | 3/1960 | Weiss |
| 3,007,650 A | 11/1961 | Burton |
| 3,058,682 A | 10/1962 | Mott et al. |
| 3,269,592 A | 8/1966 | Slye |
| 3,288,387 A | 11/1966 | Craven, Jr. |
| 3,382,021 A | 5/1968 | De Woskin |
| 3,384,280 A | 5/1968 | Summersby |
| 3,598,331 A | 8/1971 | Okamura |
| 3,628,743 A | 12/1971 | Bastian |
| 3,635,417 A | 1/1972 | Kajiwara et al. |
| 3,636,408 A | 1/1972 | Shuman |
| 3,700,181 A | 10/1972 | Diring et al. |
| 3,730,409 A | 5/1973 | Ratti |
| 3,737,087 A | 6/1973 | Rooklyn |
| 3,743,865 A | 7/1973 | Riechmann |
| 3,850,356 A | 11/1974 | Abe et al. |
| 3,858,951 A | 1/1975 | Rasmussen |
| 3,917,191 A | 11/1975 | Graham, Jr. et al. |
| 3,971,279 A | 7/1976 | Wright |
| 4,003,525 A | 1/1977 | Podvin et al. |
| 4,051,721 A | 10/1977 | Williams |
| 4,099,118 A | 7/1978 | Franklin et al. |
| 4,106,684 A | 8/1978 | Hartbauer et al. |
| 4,119,255 A | 10/1978 | D'Angelo |
| 4,148,442 A | 4/1979 | Baumann et al. |
| 4,159,807 A | 7/1979 | Honsel et al. |
| 4,165,138 A | 8/1979 | Hedge et al. |
| 4,267,752 A | 5/1981 | Byrt et al. |
| 4,358,169 A | 11/1982 | Filipowicz et al. |
| 4,378,912 A | 4/1983 | Perrin et al. |
| 4,383,657 A | 5/1983 | Suh |
| 4,464,622 A | 8/1984 | Franklin |
| 4,475,163 A | 10/1984 | Chandler et al. |
| 4,569,467 A | 2/1986 | Kaminstein |
| 4,611,768 A | 9/1986 | Voss et al. |
| 4,666,099 A | 5/1987 | Hoffman et al. |
| 4,676,131 A | 6/1987 | Cassia |
| 4,690,344 A | 9/1987 | Yokota |
| 4,700,642 A | 10/1987 | Hankinson, Jr. |
| 4,712,461 A | 12/1987 | Rasmussen |
| 4,721,265 A | 1/1988 | Hawkins |
| 4,738,176 A | 4/1988 | Cassia |
| 4,756,485 A | 7/1988 | Bastian et al. |
| 4,786,005 A | 11/1988 | Hoffman et al. |
| 4,790,490 A | 12/1988 | Chakravorty |
| 4,796,825 A | 1/1989 | Hawkins |
| 4,807,824 A | 2/1989 | Gains et al. |
| 4,823,663 A | 4/1989 | Hamlin |
| 4,826,262 A | 5/1989 | Hartman et al. |
| 4,831,488 A | 5/1989 | Playe |
| 4,846,412 A | 7/1989 | Morand |
| 4,944,466 A | 7/1990 | Jespersen |
| 4,957,023 A | 9/1990 | Chen |
| 4,960,248 A | 10/1990 | Bauer et al. |
| 4,980,289 A | 12/1990 | Temin et al. |
| 4,992,907 A | 2/1991 | Shreeve et al. |
| 5,031,258 A | 7/1991 | Shaw |
| 5,078,033 A | 1/1992 | Formon |
| 5,205,454 A | 4/1993 | Schutz et al. |
| 5,217,035 A | 6/1993 | Van Marcke |
| 5,235,882 A | 8/1993 | Rabourn |
| 5,244,161 A | 9/1993 | Wirtz-Odenthal |
| 5,257,711 A | 11/1993 | Wirtz-Odenthal |
| 5,257,748 A | 11/1993 | Morrizzo |
| 5,271,574 A | 12/1993 | Formon et al. |
| 5,294,192 A | 3/1994 | Omdoll et al. |
| 5,299,407 A | 4/1994 | Schuttler et al. |
| 5,302,167 A | 4/1994 | Kley et al. |
| 5,335,811 A | 8/1994 | Morand |
| 5,365,783 A | 11/1994 | Zweifel |
| 5,375,785 A | 12/1994 | Boone et al. |
| 5,400,982 A | 3/1995 | Collins |
| 5,452,832 A | 9/1995 | Niada |
| 5,505,129 A | 4/1996 | Greb et al. |
| 5,511,743 A | 4/1996 | Kozlowsky et al. |
| 5,526,973 A | 6/1996 | Boone et al. |
| 5,553,522 A | 9/1996 | Boldrini et al. |
| 5,558,302 A | 9/1996 | Jesperson |
| 5,604,992 A | 2/1997 | Robinson |
| 5,605,296 A | 2/1997 | Haasen et al. |
| 5,625,327 A | 4/1997 | Carroll et al. |
| 5,630,526 A | 5/1997 | Moody |
| 5,694,653 A | 12/1997 | Harald |
| 5,701,547 A | 12/1997 | Yamada et al. |
| 5,704,566 A | 1/1998 | Schutz et al. |
| 5,730,165 A | 3/1998 | Philipp |
| 5,772,291 A | 6/1998 | Byrd et al. |
| 5,806,203 A | 9/1998 | Robinson |
| 5,823,083 A | 10/1998 | Obertegger et al. |
| 5,833,413 A | 11/1998 | Cornelius |
| 5,860,344 A | 1/1999 | Yamamoto et al. |
| 5,868,343 A | 2/1999 | Granger |
| 5,899,406 A | 5/1999 | Payne |
| 5,915,645 A | 6/1999 | Granger |
| 5,950,898 A | 9/1999 | Menna |
| 5,952,835 A | 9/1999 | Coveley |
| 5,974,764 A | 11/1999 | Antsey et al. |
| 5,979,822 A | 11/1999 | Morand et al. |
| 6,032,898 A | 3/2000 | LaCount et al. |
| 6,067,673 A | 5/2000 | Paese et al. |
| 6,069,354 A | 5/2000 | Alfano et al. |
| 6,105,898 A | 8/2000 | Byrd et al. |
| 6,145,779 A | 11/2000 | Johnson et al. |
| 6,152,397 A | 11/2000 | Purcell |
| 6,279,777 B1 | 8/2001 | Goodin et al. |
| 6,293,486 B1 | 9/2001 | Byrd et al. |
| 6,354,533 B1 | 3/2002 | Jespersen |
| 6,363,824 B1 | 4/2002 | Granger |
| 6,412,679 B2 | 7/2002 | Formon et al. |
| 6,419,136 B2 | 7/2002 | Formon et al. |
| 6,460,798 B1 | 10/2002 | Haen et al. |
| 6,592,013 B1 | 7/2003 | Fujiwara |
| 6,592,067 B2 | 7/2003 | Denen et al. |
| 6,669,071 B1 | 12/2003 | Menna |
| 6,710,606 B2 | 3/2004 | Morris |
| 6,736,348 B1 | 5/2004 | Formon et al. |
| 6,742,689 B2 | 6/2004 | Formon et al. |
| 6,793,170 B2 | 9/2004 | Denen et al. |
| 6,820,785 B2 | 11/2004 | Kapiloff |
| 6,830,210 B2 | 12/2004 | Formon et al. |
| 6,838,887 B2 | 1/2005 | Denen et al. |
| 6,871,815 B2 | 3/2005 | Moody et al. |
| 6,892,620 B2 | 5/2005 | Kapiloff |
| 6,953,171 B2 | 10/2005 | Takashima |
| 7,000,520 B2 | 2/2006 | Nichols et al. |
| 7,017,856 B2 | 3/2006 | Moody et al. |
| 7,040,566 B1 | 5/2006 | Rodrian et al. |
| 7,102,366 B2 | 9/2006 | Denen et al. |
| 7,114,677 B2 | 10/2006 | Formon et al. |
| 7,161,359 B2 | 1/2007 | Denen et al. |
| 7,182,288 B2 | 2/2007 | Denen et al. |
| 7,182,289 B2 | 2/2007 | Moody et al. |
| 7,237,744 B2 * | 7/2007 | Morris et al. ............ 242/560.1 |
| 7,341,170 B2 * | 3/2008 | Boone ........................ 242/563 |
| 7,387,274 B2 | 6/2008 | Moody et al. |
| 7,398,944 B2 | 7/2008 | Lewis et al. |
| 7,424,843 B2 | 9/2008 | Guillory |
| 2002/0030061 A1 | 3/2002 | Formon |
| 2002/0109034 A1 | 8/2002 | Moody et al. |
| 2002/0109035 A1 | 8/2002 | Denen et al. |
| 2002/0109036 A1 | 8/2002 | Denen et al. |

| | | |
|---|---|---|
| 2002/0117578 A1* | 8/2002 | Denen et al. ............... 242/563 |
| 2003/0116003 A1 | 6/2003 | Kapiloff |
| 2003/0167893 A1 | 9/2003 | Morris et al. |
| 2003/0168489 A1 | 9/2003 | Formon et al. |
| 2003/0168549 A1 | 9/2003 | Formon et al. |
| 2003/0168550 A1 | 9/2003 | Formon et al. |
| 2003/0197086 A1 | 10/2003 | Denen et al. |
| 2004/0160234 A1 | 8/2004 | Denen et al. |
| 2004/0178297 A1 | 9/2004 | Moody et al. |
| 2005/0072874 A1 | 4/2005 | Denen et al. |
| 2005/0127232 A1 | 6/2005 | Moody et al. |
| 2005/0171634 A1 | 8/2005 | York et al. |
| 2006/0054733 A1 | 3/2006 | Denen et al. |
| 2007/0029435 A1 | 2/2007 | Moody et al. |
| 2007/0079684 A1 | 4/2007 | Friesen et al. |
| 2007/0194166 A1 | 8/2007 | Reinsel et al. |
| 2007/0194167 A1 | 8/2007 | Denen et al. |
| 2008/0230647 A1 | 9/2008 | Moody et al. |

FOREIGN PATENT DOCUMENTS

| | | |
|---|---|---|
| EP | 0459050 A1 | 4/1991 |
| FR | 2539293 A | 7/1984 |
| FR | 2583729 A1 | 12/1986 |
| FR | 2771620 A1 | 4/1999 |
| GB | 2058014 A | 4/1981 |
| GB | 2267271 A | 1/1993 |
| WO | 99/33008 A2 | 7/1999 |

OTHER PUBLICATIONS

International Search Report and Written Opinion of the International Searching Authority of PCT/US2007/062343, dated Sep. 26, 2007.
English translation of FR 2539293, publication date Jul. 20, 1984.
English translation of DE 3342921, publication date Jun. 5, 1985.
English Translation of FR 2583729, publication date Dec. 26, 1986.
Definition of the word "switch", Dictionary.com Unabridged (v1.1), Random House, Inc., 2006, Dictionary.com, http://dictionary.reference.com/browse/switch, retrieved Nov. 20, 2008, 8 pages.
Definition of the word "port", The American Heritage® Dictionary of the English Language, Forth Edition, Houghton Mifflin Company, 2004, Dictionary.com, http://dictionary.reference.com/browse/port, retrieved Nov. 20, 2008, 18 pages.

* cited by examiner

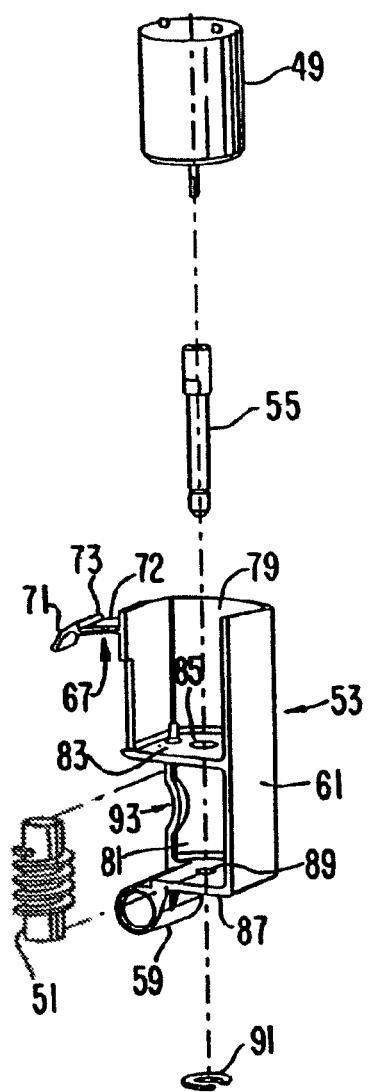
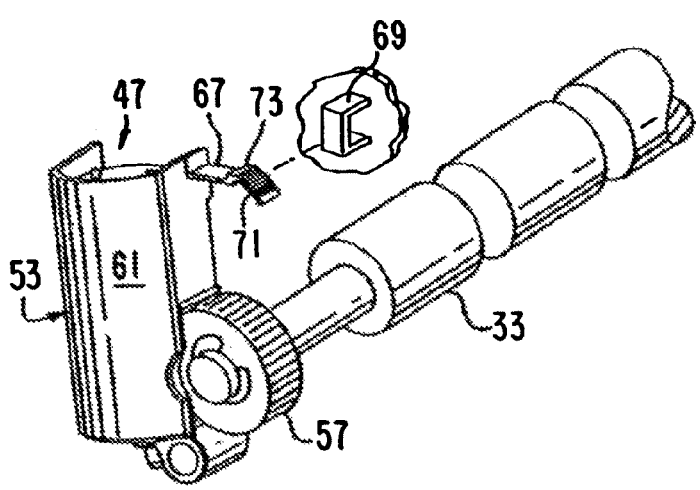
FIG. 7
FIG. 8

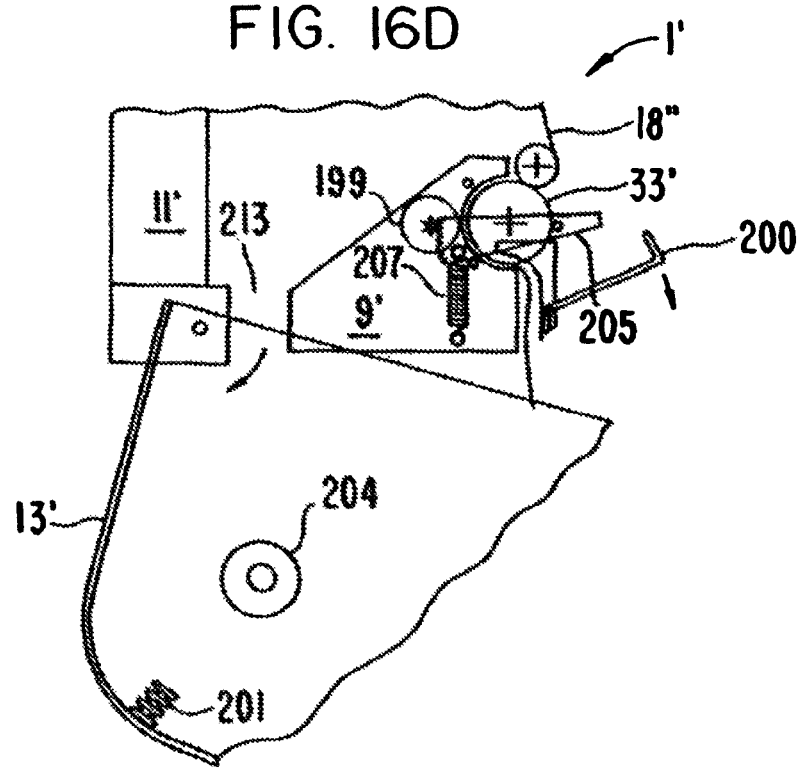
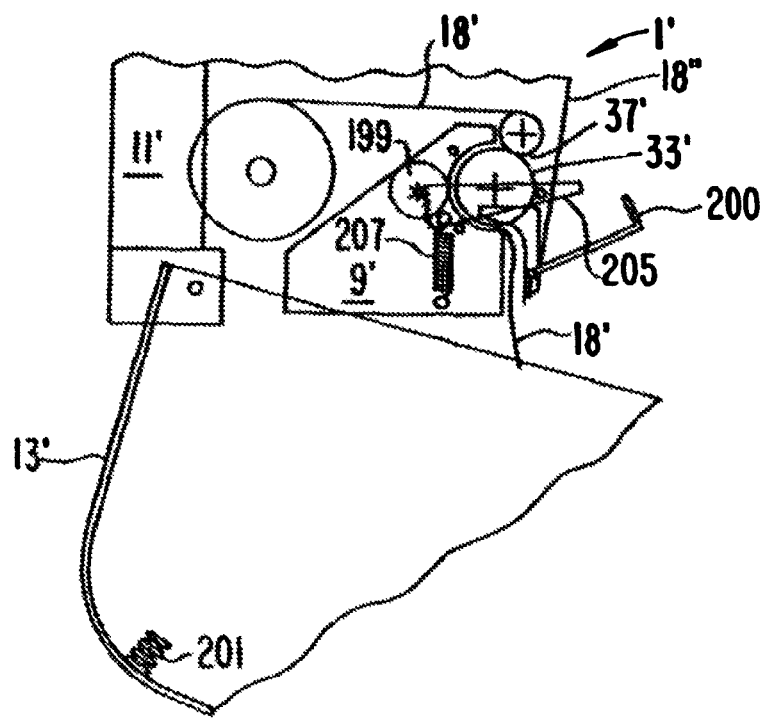

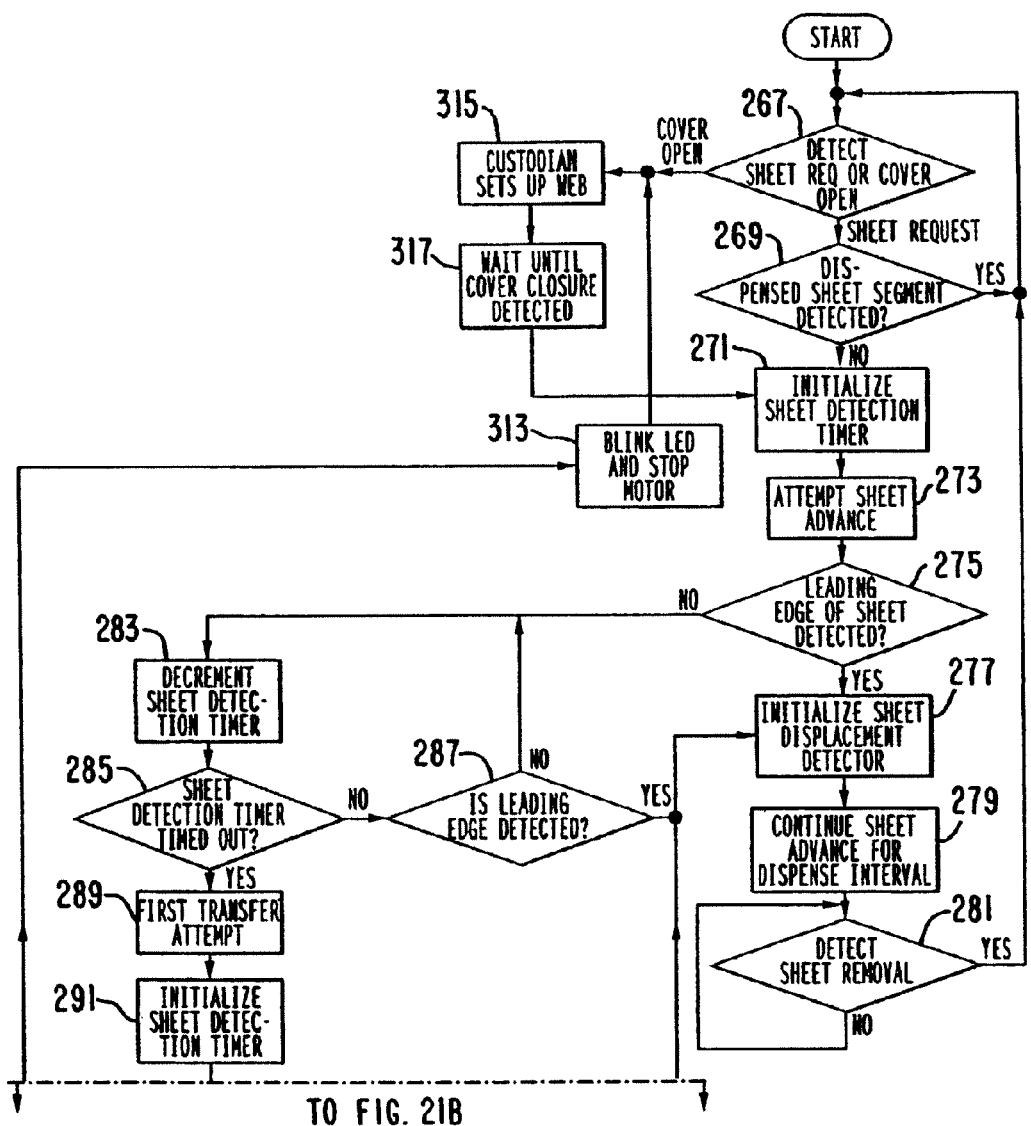

APPARATUS AND METHODS USABLE IN CONNECTION WITH DISPENSING FLEXIBLE SHEET MATERIAL FROM A ROLL

CROSS REFERENCE TO RELATED APPLICATIONS

This application is a division of U.S. application Ser. No. 10/092,350, filed Mar. 7, 2002, which is herein incorporated by reference in its entirety.

FIELD OF THE INVENTIONS

The present inventions relate to the dispensing of flexible sheet material from a roll. In particular, the present inventions relate to various features that may be advantageously used by themselves or in conjunction with each other, in connection with the dispensing of web products (e.g., paper towels or napkins) from a roll in an institutional setting. A proximity sensing circuit and method in accordance with one invention may be advantageously applied in virtually any application where it is desired to detect the presence or proximity of a user or object relative to something else. The inventions described herein compliment each other as well as: the powered dispensing and user sensing related inventions disclosed in co-pending commonly owned patent application Ser. No. 09/081,637, filed May 20, 1998; and the powered feed transfer related inventions described in co-pending commonly owned application Ser. No. 09/604,811, filed Jun. 28, 2000.

BACKGROUND OF THE INVENTIONS

Dispensers for toweling have primarily fallen into one of three categories: those that dispense segments of a continuous (endless) towel, those that dispense individual folded paper towels, and those that dispense towel segments separated from a roll of paper sheet material. Continuous towels are generally made of a reusable material and form a towel loop outside of the dispenser cabinet that may be grasped for use. Folded paper towels are generally pre-cut and folded into various configurations to be individually dispensed for use. Rolls of paper toweling are generally wound around a central core. Upon dispensing, segments of the sheet material are delivered from the dispenser and separated from the roll by tearing or cutting performed by the dispenser and/or the user.

Continuous web dispensers, such as those disclosed in U.S. Pat. No. 2,930,663 to Weiss and U.S. Pat. No. 3,858,951 to Rasmussen, require the user to pull on the loop of exposed toweling in order to cause a length of clean toweling to be dispensed and the exposed soiled toweling to be correspondingly taken up within the dispenser. Although economical, the continuous exposure of the soiled toweling is deemed unsightly and, therefore, unacceptable to many consumers when compared to the many available alternatives. Further, the exposure and possible reuse of soiled toweling may present additional health hazards and sanitation concerns which should be avoided.

The use of interfolded paper towels or C-fold paper towels eliminates the potential health risks associated with continuous web toweling. For instance, dispensers for folded paper towels, such as disclosed in U.S. Pat. No. 3,269,592 to Slye et al., allow a user to dispense the towels by pulling on the exposed end of each new individual towel. These dispensers are also easy to refill with folded towels. However, a number of the folded towels will sometimes drop out of the lower opening of the dispenser when only the exposed towel is pulled, especially when the stack of towels in the dispenser is small. This can result in a significant waste of paper towels. Accordingly, folded towels are not as economical as other kinds of alternative dispensers.

Roll towels are cheaper to manufacture and produce less waste than folded towels. Roll towels also eliminate the potential health and sanitation problems associated with continuous web toweling systems. Dispensers for roll towels may include a lever, crank, or other user-activated mechanism for dispensing a length of towel, and a blade for severing the length of towel from the remaining roll. However, as can be appreciated, manual contact with a dispensing lever or the like raises health concerns for the user. To alleviate these health concerns, dispensers, such as U.S. Pat. No. 4,712,461 to Rasmussen, eliminate contact with any part of the dispenser, and instead rely upon the user directly pulling the paper towel out of the dispenser. As a result, the paper towel must be provided with sufficient strength to effect rotation of the feed roller and actuation of the blade without premature tearing. Paper possessing the requisite strength to operate the dispenser is limited in the amount of softness and absorbency which can be provided to the paper towels.

Dispensers for roll towels have also been electrically powered. As shown in U.S. Pat. No. 5,452,832 to Niada, a light sensitive device is used to detect the presence of a user's hand in front of the dispenser and advance the toweling for a predetermined length of time. The dispensed length of paper towel is then separated from the continuous web by pulling the paper against a serrated cutting member. While the feed roller is powered, the cutting action still requires the paper to possess a certain minimum strength and generally produces a rough, unsightly cut.

U.S. Pat. No. 4,738,176 to Cassia discloses an electrically powered dispenser which also includes a reciprocating cutter to produce an individual towel from the continuous web of paper. While this arrangement enables the use of softer and more absorbent paper, the dispenser requires a substantial amount of energy to drive the feed mechanism and the reciprocating cutter. Accordingly, the batteries must be replaced relatively frequently. Moreover, the system is more complex and costly with its use of one-way clutches.

Also, in some electrically powered dispensers, such as U.S. Pat. No. 4,796,825 to Hawkins, the paper will continually dispense while a hand or other object is placed in front of the sensor. Hence, the dispenser is subject to easy abuse and waste of paper. Moreover, some dispensers are subject to dispensing paper by the general proximity of a person irrespective of whether a paper towel is needed. In an effort to avoid abuses, some dispensers, such as U.S. Pat. No. 4,666,099 to Hoffman, have incorporated a waiting period where the dispenser will not operate for a brief time after each use. However, the need to wait can be frustrating to users under some circumstances.

Previously mentioned copending application Ser. No. 09/081,637 discloses an electric motor powered dispenser which overcomes many of the disadvantages of the prior art described above. For example, in one aspect, the dispenser facilitates the dispensing of a roll of paper with spaced apart transverse lines of tearing (e.g. perforation lines) for easily separating individual sheets from the continuous roll without cutting. As a result, paper with a high degree of softness and absorbency can be used without the high energy demands required by a reciprocating cutter. In another aspect, the dispenser senses the leading edge of the continuous web of paper material to initiate a control device which controls the length of each segment of paper. In this way, the dispenser can always place the transverse tearing line at the proper position in relation to the discharge opening for each dispensed sheet, irrespective of variations of the spacing for the tearing lines within a tolerance range. In another aspect, the dispenser includes a sensor for sensing the presence of a sheet that has been dispensed, but not removed, in order to prevent the dispenser from dispensing any more sheets until the previous sheet has been torn off. In this way, abuse of the dispenser and waste of the paper material can be minimized without requiring the use of a waiting period wherein the dispenser will not operate. Accordingly, the dispenser is always ready for use.

Other systems have been developed for sensing the proximity of, for example, a hand to a dispenser for controlling dispensing of an item, such as paper towels, water, hand soap, etc. For example, U.S. Pat. No. 5,694,653 to Harald discloses a system that senses the proximity of a person's hands to a water faucet, thereby providing hands-free operation of the faucet. According to Harald, the spout of a water faucet is coupled to an oscillator and functions like a transmitting antenna by emitting a time-varying primary electrostatic field. When a person's hands are placed in the primary electrostatic field in proximity of the spout, the person's body begins to radiate a secondary field in syncopation with the primary field. A receiver antenna located away from the spout, such as behind the front panel of a vanity, receives the secondary field, which is processed for turning on the water. Several different receiver antennas can be used for detecting the relative position of a hand with respect to a particular receiver antenna for controlling, e.g., the temperature of the water. To provide sufficient sensitivity so that proximity of a hand with respect to the Harald sensor system operates reliably, the signal driving the faucet spout must be shielded from the receiving antennas. Additionally, the receiving antennas must be oriented and shielded to avoid detecting the primary field.

U.S. Pat. No. 6,279,777 B1 to Goodin et al. discloses another hands-free proximity sensing system for a dispenser. According to Goodin et al., a proximity sensing system includes a theremin sensor and a second sensor, such as a conventional infrared, ultrasonic, heat, light, proximity or audio sensor detector, for detecting the presence of a human body part in proximity to the dispenser. The theremin sensor includes two closely-spaced antenna panels that establish a capacitance therebetween independent of a ground connection. The antenna panels are coupled to an oscillator circuit that oscillates at a frequency related to the capacitance established between the two panels. When a person's hand comes into close proximity of the panels, the capacitance provided by the persons' hands increases the capacitance between the two antenna panels, and thereby changes the frequency of oscillation and a first output signal is generated. The second sensor independently senses the presence of the person's hand and also generates a second output signal. The dispenser, in response to the first and second output signals, performs a dispensing operation. While the Goodin et al. sensing system purports to provide high reliability in avoiding false sensing situations, it is apparent that the stray capacitance provided by the environment in which a Goodin et al. sensor is installed may adversely affect the frequency of oscillation of the oscillator such that the oscillator circuit must be calibrated so that the sensitivity of the theremin sensor can reliably sense the change in capacitance provided by a person's hand.

As described above, roll towel dispensers may utilize a manual drive mechanism such as a user operated crank or lever to drive a feed mechanism to dispense the towels, or alternatively a powered drive mechanism. In either case, the feed mechanism typically will include a drive roller and a pressure roller, also known as a pinch roller, which form a nip. When the rolled paper runs out in a conventional roll dispenser, an attendant must replace the roll and manually insert the leading edge of the new roll into the nip. This can require complex towel threading and loading sequences. After the attendant has placed the leading edge of the roll into the nip, the feed mechanism is operated in order to advance the leading edge through the feed mechanism, thereby causing a length of paper towel to be unwound from the roll core and delivered to the user.

In contrast to folded paper towel dispensers, conventional roll towel dispensers do not provide an economical way to replenish the towel supply when a partially depleted roll, i.e., a "stub" roll, remains within the dispenser. In some prior art dispensers, a new roll must be substituted for the stub roll, thereby resulting in the waste of whatever paper remains on the stub roll. This can result in increased operational costs as a significant amount of paper may be wasted in facilities with many dispensers. To overcome the problem of stub roll waste, other roll dispensers have been designed to dispense two rolls of web material sequentially such that upon depletion of a primary roll, feeding from a reserve roll is commenced.

Prior art systems have accomplished this transfer by either modifying the end of the web material or modifying the roll core upon which the web material is wound, such as the system disclosed in U.S. Pat. No. 3,288,387 to Craven, Jr. Alternatively, the systems of U.S. Pat. No. 3,628,743 to Bastian et al. and U.S. Pat. No. 5,294,192 to Omdoll et al. sense the diameter of the primary roll in order to activate the transfer to the reserve roll, and the system of U.S. Pat. No. 3,917,191 to Graham, Jr. et al. senses the tension in the primary roll in order to detect when it is nearly exhausted. Unfortunately, tension responsive transfers are not particularly reliable since conditions other than reaching the end of the roll can trigger their operation, such as the slackening of the web or a break in the web material. Diameter responsive transfers also have a drawback in that the reserve web begins dispensing prior to the complete exhaustion of the primary roll. Thus, for a short time web material is dispensed simultaneously from both rolls and again results in a waste of material.

In efforts to overcome these disadvantages, the systems of U.S. Pat. No. 4,165,138 to Hedge et al., U.S. Pat. No. 4,611,768 to Voss, et al., and U.S. Pat. No. 4,378,912 to Perrin et al. provide transfer mechanisms that sense the absence or presence of paper from around a feed roll. In one system, this is accomplished by a sensing finger which rides along the top surface of the web material and then drops down into a groove in the feed roll which is exposed when the trailing end of the primary web has been unwound from the roll. In response to the sensing finger moving into the groove, the reserve web is introduced into the feed nip between the drive roller and the pressure roller, and the dispenser begins to feed the reserve roll to the user. This type of transfer mechanism generally eliminates the false transfers associated with tension responsive systems and reduces the amount of double sheet dispensing which occurs in diameter sensing transfer systems. The use of sensing fingers on the web material, however, produces extra friction which can inadvertently tear the web. Moreover, the introduction of additional components to sense the absence of the web and transfer the reserve web to between the feed rollers creates opportunities for a transfer failure to occur.

A need has therefore existed for a flexible sheet dispenser having an automatic transfer mechanism which, in addition to substantially eliminating simultaneous dispensing from both primary and reserve rolls, requires few additional parts within the dispenser and which is not prone to interference with the proper dispensing of either the working or reserve roll web material. A transfer mechanism that, to a large extent, fulfills this need is described in commonly assigned U.S. Pat. No. 5,526,973 to Boone et al. Therein, movement and interengagement of one grooved feed roller relative to the other upon depletion of a stub roll, actuates a transfer mechanism that introduces a reserve web into the feed nip. While generally quite effective, the movement and spring biasing of a relatively high mass feed roller can lead to difficulties. The feed roller spring bias force must be within a relatively narrow window. If the spring bias is set too high, the biasing force may inhibit smooth feeding of the web material through the rollers, and result in tearing of the web material. If it is set too low, the mechanism may not actuate effectively to cause a transfer of feed to the reserve roll immediately upon depletion of the stub roll. Over time, the spring bias provided to move one roll relative to the other is prone to eventually decrease, e.g., due to fatigue of the spring, such that ultimately the spring force may fall below the required relatively narrow range and thus be insufficient to properly actuate a web transfer.

Previously mentioned co-pending application Ser. No. 09/604,811 discloses a dispenser having an electric motor powered transfer mechanism that overcomes many of the disadvantages of the prior art described above. That dispenser can provide hands free, automatic feeding of a first sheet of a primary web roll, such as a paper towel roll, into a feed mechanism when its cover is closed. The dispenser can also automatically transfer its web feed supply from a working roll to a reserve roll upon the exhaustion of the working roll. The design eliminates the need for an attendant to thread the leading edge of a roll into the feed mechanism of the dispenser. It also reduces wasted paper because it does not begin to feed from a reserve roll until the working roll has been fully depleted. The dispenser includes a chassis having a web discharge opening and a feed mechanism for advancing the web to the web discharge opening. The dispenser also includes a sensor for determining when a portion of the web is absent from a side of the feed mechanism proximate the web discharge opening. When such an absence is sensed, an automatic, powered web transfer mechanism contacts the web located in front of the feed mechanism and positions it in the feed nip, i.e., between the rollers of the feed mechanism. The transfer mechanism includes a web transfer member and a motor for driving the transfer member in the direction of the feed mechanism. The dispenser also includes a retraction mechanism for returning the transfer bar to a rest position after the web has been introduced into the feed mechanism.

SUMMARY OF THE INVENTIONS

The present inventions arose out of efforts to develop a "next generation" sheet material dispenser providing increased convenience and simplicity of use and maintenance. In particular, it was an object of the inventors to provide a dispenser capable of carrying out dispensing operations in a reliable and controlled manner that would avoid the need for a user to make physical contact with the dispenser. The inventors also sought to develop a dispenser that would, by virtue of its various features, minimize dispenser downtime due to depletion of the dispensed roll material or the dispenser power supply, or due to jams of the feed mechanism. Moreover, the inventors sought to develop a dispenser that would improve the efficiency of institutional/building maintenance operations, by facilitating dispenser maintenance by unskilled personnel.

It is an object of one of the present inventions to provide a proximity sensing system that senses the proximity of a person's hand or other body part, based on the capacitance provided by the body part, and that automatically compensates for environmental changes by adjusting the sensitivity of the sensor so that changes in capacitance provided by a person's hand (or other body part) are reliably sensed, regardless of the variations in stray capacitance provided by the environment in which the proximity sensor is placed.

One or more of the above, and/or other objects, are achieved by the various inventions disclosed and claimed herein.

According to a first one of the inventions, a dispenser is provided for dispensing flexible sheet material. The dispenser includes a support for rotatably supporting a roll of sheet material. A feed mechanism is provided for advancing the sheet material out of the dispenser. A drive member is provided for driving the feed mechanism. The drive member is movably mounted for movement into and out of engagement with the feed mechanism. A hold mechanism is provided for holding the drive member in engagement with the feed mechanism. The hold mechanism is manually releasable to permit the drive member to be moved out of engagement with the feed mechanism.

According to a second one of the inventions, a drive mechanism assembly is provided for selectively engaging with and driving a feed mechanism of a flexible sheet material dispenser. The drive mechanism assembly includes a motor having a drive shaft, and a drive member attached to the drive shaft for drivingly engaging the feed mechanism in an engagement position. A carrier retains therein the motor and the drive member. The carrier includes a rotatable mounting member for rotatably mounting the motor and drive member to a dispenser chassis for rotation as a unit into and out of the engagement position.

According to a third one of the inventions, a method of removing a jam from a dispenser for dispensing flexible sheet material is provided. A sheet material jam is detected. A drive mechanism of the dispenser is disengaged from a feed mechanism of the dispenser. The jam is cleared from the path of the feed mechanism by rotating the feed mechanism while it is disengaged from the drive mechanism. The drive mechanism is then reengaged with the feed mechanism.

According to a fourth one of the inventions, a dispenser for dispensing flexible sheet material includes a feed mechanism, a drive mechanism for selectively driving the feed mechanism, and a control device for controlling the drive mechanism. A battery container is provided for removably holding at least one battery for powering at least one of the drive mechanism and the control device. A power line input port is provided, to which a power line may be connected to supply power to at least one of the drive mechanism and the control device in lieu of battery power. The power line input port is arranged in relation to the battery container such that (1) when the battery container is loaded with the at least one battery to supply power to at least one of the drive mechanism and the control device, the line input port is prevented from being connected to the power line; and (2) when the battery container is unloaded, the power line input port is readily accessible for connection of the power line.

According to a fifth one of the inventions, a dispenser for dispensing flexible sheet material includes a support for rotatably supporting a roll of sheet material, a feed mechanism for advancing the sheet material from the roll, and a motor for driving the feed mechanism. A structure defines a discharge chute of the dispenser downstream of the feed mechanism. A sensor is provided for detecting the presence and absence of sheet material in the discharge chute and outputting respective first signals indicative thereof. A proximity sensing system including an RF antenna is provided for detecting the presence of a user's hand in close proximity to the dispenser, and outputting a second signal indicative thereof. A control device is provided for receiving the respective first signals, and the second signal, and for controlling the motor to selectively drive the feed mechanism in response thereto. The sensor is mounted on a first printed circuit board mounted on the structure adjacent to the discharge slot. The antenna is mounted on a second printed circuit board mounted on the structure and positioned in overlying relation to the first printed circuit board.

According to a sixth one of the inventions, a dispenser for dispensing flexible sheet material includes a support for rotatably supporting a roll of sheet material. A feed mechanism is provided for advancing the sheet material from the roll. A motor is provided for driving the feed mechanism, and a structure defines a discharge chute of the dispenser downstream of the feed mechanism. A transfer mechanism is provided for contacting a leading segment of sheet material extending from a roll, and for moving the sheet material into a feed nip of the feed mechanism. A sensor is provided for detecting the presence and absence of sheet material in the discharge chute and outputting respective signals indicative thereof. A control device is provided for receiving the respective signals, and for controlling the motor to selectively drive the feed mechanism in response thereto, to dispense a predetermined length of the sheet material from the point at which a leading edge portion is detected by one of the plurality of sensors. The control device further determines, based upon the signals, a condition wherein a working roll of sheet material is either absent or depleted, and in response to that determination controls the transfer mechanism to attempt a transfer of feed to a new roll of sheet material.

According to a seventh one of the inventions, a dispenser for dispensing flexible sheet material includes a support for rotatably supporting a roll of sheet material, a feed mechanism for advancing the sheet material from the roll, and a motor for driving the feed mechanism. A plurality of sensors are spaced along a width of the sheet material for detecting respective leading edge portions of the sheet material and outputting respective signals indicative thereof. A control device is provided for receiving the respective signals and controlling the motor to drive the feed mechanism to dispense a predetermined length of the sheet material from the point at which a leading edge portion is first detected by one of the plurality of sensors.

According to an eighth one of the inventions, a dispenser for dispensing flexible sheet material includes a support for rotatably supporting a roll of sheet material, a feed mechanism for advancing the sheet material from the roll, and a motor for driving the feed mechanism. A sensor is provided for detecting a leading edge portion of the sheet material and outputting a signal indicative thereof. A measurement device is provided for measuring a first interval of advancement of the feed mechanism terminating with a detection of a leading edge portion by the sensor. A control device is provided for receiving signals from the sensor and the measurement device, and for controlling the motor to drive the feed mechanism to dispense a predetermined length of the sheet material from a determined initialization point. The control device includes a storage device for storing a nominal measure of the first interval of advancement, a comparator for comparing a measurement of the measurement device with the nominal value, and determination means for determining the initialization point for a given dispense cycle based upon an output of the comparator.

According to a ninth one of the inventions, a dispenser includes a housing having a discharge opening. A support is provided within the housing for supporting a continuous strip of sheet material having a plurality of spaced tear lines defining leading and trailing edges of individual removable segments, with an outer segment having a free leading edge and inner segments which in turn become outer segments as adjoining outer segments are removed. A feed mechanism is provided for repeatedly moving the sheet material in advancement and retraction intervals. The advancement intervals serve to advance successive outer ones of the segments through the discharge opening and out of the housing. The retraction intervals serves to initialize the sheet material for the advancement interval. A sensor is provided for repeatedly detecting arrival of a leading edge of retracting sheet material at a first position defining the end of the retraction interval and the beginning of the advancement interval, as sheet material is repeatedly retracted back into the discharge opening. A control device is provided for receiving a signal from the sensor indicating an arrival of a leading edge at the first position, and for initiating the advancement interval from the first position. The advancement interval terminates when the leading edge of the sheet material has advanced from the first position a pre-determined amount, to repeatedly place the spaced tear lines at a second position that is variable downstream of the first position in relation to variations in the lengths of the segments. The second position defines the beginning of a retraction interval for a next adjacent segment, when it is in turn initialized for an advancement interval.

According to a tenth one of the inventions, a dispenser for dispensing flexible sheet material from a roll includes a chassis defining a web discharge opening and a feed mechanism for advancing the sheet material to the discharge opening. A detection system is provided for detecting an absence of sheet material within the feed mechanism. A transfer mechanism is provided for contacting a leading segment of sheet material extending from a roll and moving the sheet material into a feed nip of the feed mechanism. The transfer mechanism includes a transfer member biased toward the feed nip and into contact with the leading segment of sheet material. A transfer link is movable between a first position wherein the transfer link retains the transfer bar away from the feed nip, against the bias, and a release position wherein the transfer link permits the transfer member to move toward the feed nip under the bias and into contact with the leading segment of sheet material. An actuator, e.g., a motor, is provided for driving the transfer link from the first position to the release position. Control means are provided for electrically activating the actuator to drive the transfer link from the first position to the release position in response to the detection system detecting an absence of sheet material within the feed mechanism.

According to an eleventh one of the inventions, a dispenser for dispensing flexible sheet material includes a chassis defining a gap for passage of a sheet material roll core therethrough. At least one finger-operable, releasable support mechanism is connected to the chassis for rotatably supporting the core above the gap. The support is movable from a core retention position to a core release position for releasing the core into the gap. A dispenser cover is movably mounted to the chassis for movement between a closed position and an open position. The cover is situated, when in the open position, to receive a core dropped through the gap.

In a twelfth one of the present inventions, a proximity sensor circuit includes an antenna, an oscillator circuit and an automatic sensitivity control circuit. The antenna has a baseline stray capacitance. The oscillator circuit is coupled to the antenna and generates an oscillation signal having a predetermined oscillation amplitude corresponding to the baseline stray capacitance of the antenna. Preferably, the oscillator circuit has a Colpitts oscillator-type topography. The oscillation amplitude of the oscillation signal increases in response to an increase in stray capacitance from the baseline stray capacitance of the antenna and decreases in response to a decrease in stray capacitance from the baseline stray capacitance of the antenna. The automatic sensitivity control circuit is coupled to the oscillator circuit and detects a change in the oscillation amplitude of the oscillator signal.

According to preferred embodiments of this invention, the automatic sensitivity control circuit controls the amplitude of the oscillator signal by controlling a current in the oscillator circuit, thereby counteracting a change in stray capacitance from the baseline stray capacitance of the antenna and maintaining the oscillation amplitude of the oscillator signal at the predetermined oscillation amplitude, to provide a substantially constant sensitivity to changes in stray capacitance from the baseline stray capacitance of the antenna. The proximity sensor circuit preferably generates a detect signal when the automatic sensitivity control circuit detects an increase in the oscillation amplitude of the oscillator signal, such as when a hand is placed in proximity to the antenna. A shield is preferably coupled to and driven by the oscillator circuit, thereby reducing the baseline stray capacitance of the antenna by an amount that may be about two orders of magnitude greater than an increase in stray capacitance sensed by the proximity sensor circuit for generating the detect signal.

In a thirteenth one of the present inventions, a method is provided for providing substantially constant sensitivity for sensing changes in a baseline stray capacitance to an antenna. According to this invention, an oscillation signal is generated by an oscillator circuit, preferably having a Colpitts oscillator-type topography, and coupled to the antenna. The oscillation signal has a predetermined oscillation amplitude corresponding to the baseline stray capacitance of the antenna. The oscillation amplitude of the oscillation signal increase in response to an increase in stray capacitance from the baseline stray capacitance of the antenna and decreases in response to a decrease in stray capacitance from the baseline stray capacitance of the antenna. A change in the oscillation amplitude of the oscillator signal is preferably detected and the amplitude of the oscillator signal is preferably controlled by controlling a current in the oscillator circuit to counteract the detected change in stray capacitance from the baseline stray capacitance of the antenna. The oscillation amplitude of the oscillator signal is maintained at the predetermined oscillation amplitude to provide a substantially constant sensitivity to changes in stray capacitance from the baseline stray capacitance of the antenna. A detect signal is preferably generated when an increase in the oscillation amplitude is detected, such as when a hand is placed in proximity to the antenna. The oscillator circuit may include a shield that is driven with a signal related to the oscillation signal, thereby reducing the baseline stray capacitance of the antenna by an amount that may be about two orders of magnitude greater than an increase in stray capacitance that generates the detect signal.

According to a fourteenth one of the inventions, a dispenser for dispensing flexible sheet material from a roll includes a support for rotatably supporting a roll of sheet material having a plurality of spaced apart tear lines defining individual segments of sheet material, a feed mechanism for advancing sheet material from the roll, and a motor for driving the feed mechanism. A transfer mechanism is provided for transferring a leading portion of a leading segment of the sheet material into the feed mechanism, such that the leading portion is folded over during the transfer to form a folded-over edge portion. A sensor is provided for detecting a leading edge of the sheet material. A control means is provided for controlling application of power to the motor to drive the feed mechanism so as to carry out dispensing operations wherein predetermined lengths of sheet material are dispensed from leading edges of the sheet material detected by the first sensor. The control means further controls operation of the transfer mechanism. In a first dispensing operation carried out by the control device following an operation of the transfer mechanism, the control device controls the motor so as to carry out an initial dispensing operation wherein a first predetermined length of sheet material is dispensed from the point at which the leading edge is detected by the sensor, and to carry out subsequent dispensing operations wherein a second predetermined length of sheet material larger than the first predetermined length is dispensed from the point at which subsequent leading edges are detected by the sensor, the difference between the first predetermined length and the second predetermined length corresponding approximately to a length of the folded-over portion, such that a tear line between the first segment of sheet material and a second segment of sheet material is, following the initial dispensing operation, positioned between the feed mechanism and the first sensor, and subsequent tear lines between subsequent segments of the sheet material are positioned between the feed mechanism and the first sensor, following subsequent dispensing operations.

According to a fifteenth one of the inventions, a dispenser for dispensing flexible sheet material includes a chassis, a support for rotatably supporting a roll of sheet material within the chassis, a feed mechanism for advancing the sheet material, and a motor for driving the feed mechanism. A dispenser cover is movably mounted with respect to the chassis for movement between a closed position and an open position. The cover has a surface defining a dispensing slot. The surface moves into overlying registry with a discharge slot-defining portion of the chassis when the cover is moved into the closed position such that a leading segment of sheet material extending from the discharge slot when the cover is in the open position may become lodged between the cover and the chassis when the cover is moved to the closed position. A sensor for sensing when the cover is in the open position and when the cover is in the closed position. The sensor outputs a signal indicative thereof. A control device is provided for controlling the motor to drive the feed mechanism so as to dispense a predetermined length of the sheet material in response to the sensor indicating that the cover has been moved to the closed position. The predetermined length of sheet material is sufficient to cause a leading segment of sheet material lodged between the chassis and the cover to loop out of the dispensing slot formed in the cover.

The above and other objects, features and advantages of the present inventions will be readily apparent and fully understood from the following detailed description of preferred embodiments, taken in connection with the appended drawings.

BRIEF DESCRIPTION OF THE DRAWINGS

FIG. 7 is an exploded perspective view of the releasable drive mechanism of FIG. 5.

FIG. 8 is a diagrammatic perspective view showing, in isolation, the releasable drive mechanism engaged with the driven gear.

FIGS. 16A-16E are diagrammatic side elevational views showing, sequentially, operation of an alternative web feed transfer mechanism providing a powered release of a spring biased transfer bar.

FIGS. 21A and 21B are respective parts of a control flow diagram for program logic that may be implemented in conjunction with the electrical control system of FIG. 20.

DETAILED DESCRIPTION OF THE PREFERRED EMBODIMENTS

Figure 1:
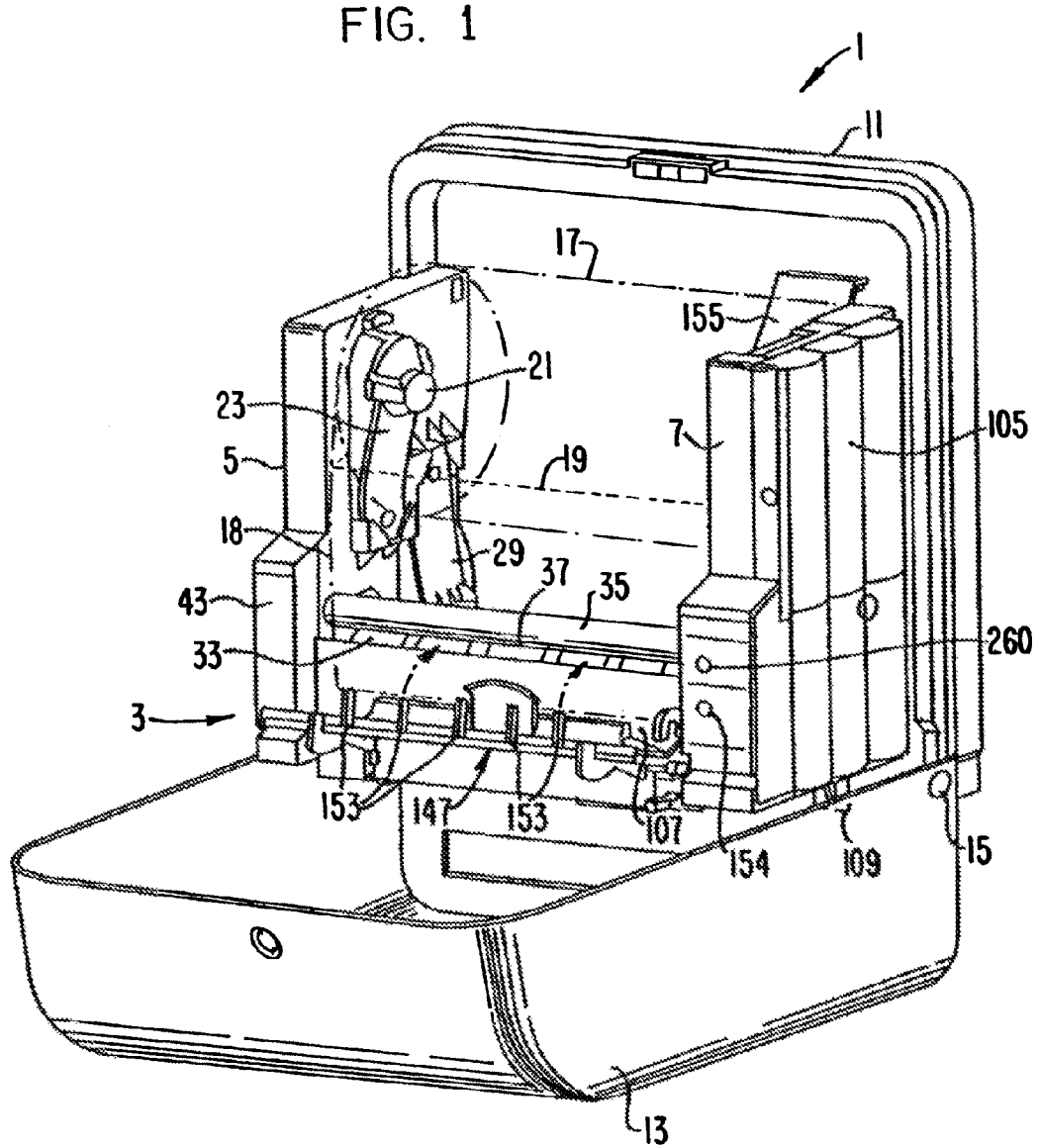
FIG. 1 is a perspective view of a roll towel dispenser embodying many of the present inventions, with a cover thereof pivoted to an open position.
Figure 2:
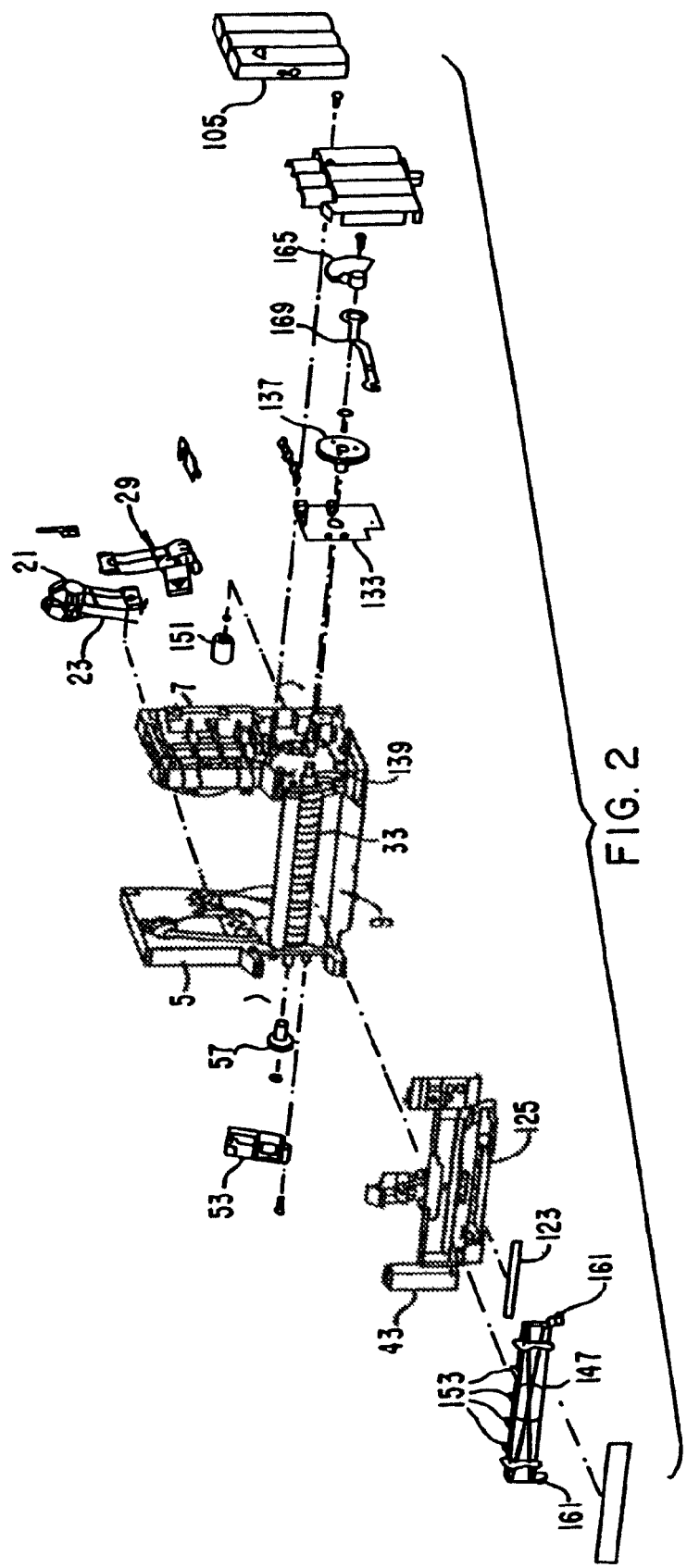
FIG. 2 is a perspective view of a chassis assembly of the dispenser shown in FIG. 1, with parts exploded therefrom.
Figure 3:
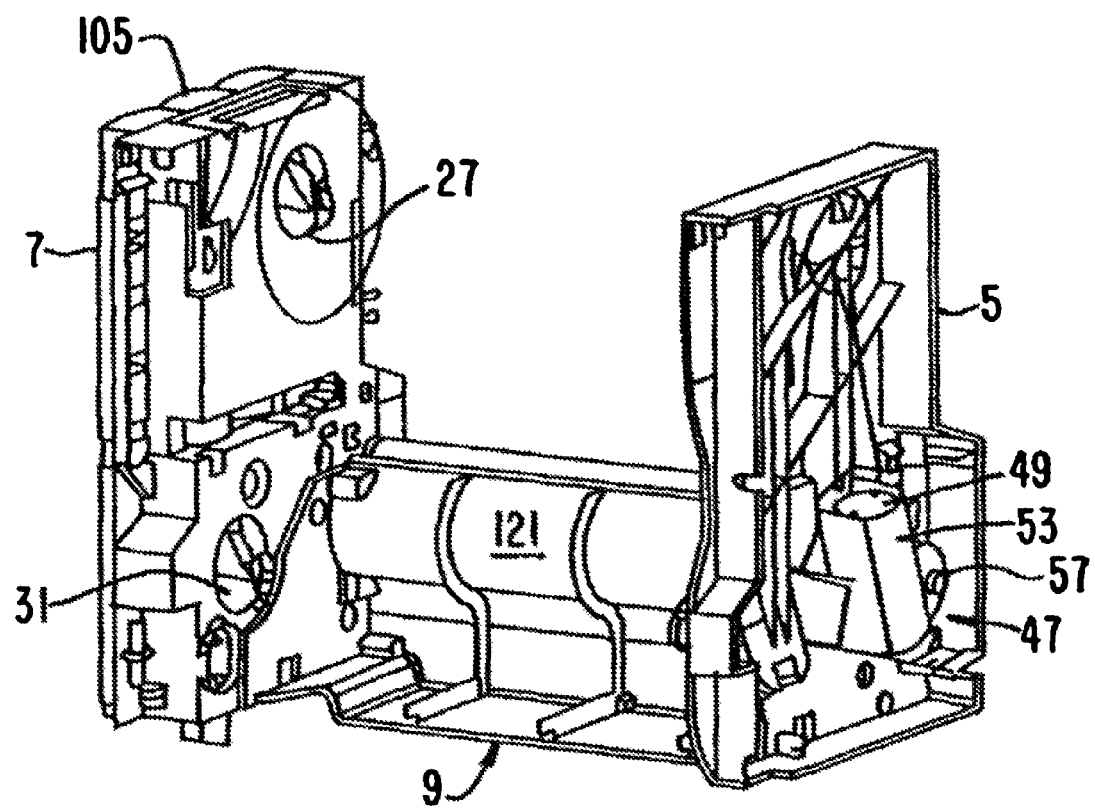
FIG. 3 is a rear side perspective view of the chassis assembly and parts shown in FIG. 2.

Referring first to FIGS. 1-3, a paper towel dispenser 1 according to the present invention comprises a chassis assembly 3 that includes a right side chassis member 5, a left side chassis member 7, and a middle chassis member 9 extending between the side chassis members. Dispenser 1 further includes a back panel member 11 and a pivotal front cover 13 attached, by a pin 15, hinge or other convenient attachment mechanism, to back panel member 11. Front cover 13 may be opened and pivoted away from chassis assembly 3 to a web loading position (as shown) allowing a roll 17 of a web material 18 to be loaded into dispenser 1.

In the illustrated exemplary embodiment, roll 17 comprises a continuous web 18 of flat segments of paper towel material wound upon a hollow cylindrical core. Dispenser 1 could, of course, dispense other flexible webs, paper or otherwise. The web could, e.g., be in the form of folded sheet segments wound onto a roll and separable from each other along lines of perforation to form folded napkins. In the illustrated preferred embodiment, web 18 of roll 17 includes a series of spaced apart, transverse tear lines 19 (one shown) which subdivide the web into flat sheet (towel) segments of a predetermined length. Roll 17 is rotatably supported between an upper pair of supports. One of the supports comprises an inwardly directed hub 21 attached to the free end of a spring arm 23 extending upwardly and inwardly along an inside of right side chassis member 5 from a cantilever mounting point 25. An opposite hub 27 (see FIG. 3) protrudes inwardly directly from an inside of left side chassis member 7. Each inwardly directed hub 21, 27 is loosely received within a core of roll 17 to permit free rotation of roll 17. Of course, numerous other roll mounting arrangements could also be used.

To load a roll into dispenser 1, the attendant first opens front cover 13 to the position shown in FIG. 1. Dispenser 1 is designed to accommodate a working roll and a reserve roll. In the interest of dispenser size reduction, the space defined between a lower pair of roll supports 29, 31 of dispenser 1 is restricted such that a full roll (as may be positioned in the upper pair of supports) cannot be placed therein until after it has been depleted by about 60%. At such time, the partially depleted working roll (now a stub roll) may be transferred by an attendant to lower set of supports 29, 31. As will be described in detail, this can be done while a leading portion of the towel web remains fed through the dispenser feed mechanism. Thereafter, a new (reserve) roll may be loaded into the upper pair of roll supports. In other possible embodiments (having a larger space defined between lower roll supports 29, 31), the attendant can have the option to initially load both rolls into the dispenser at the same time.

Middle chassis member 9 provides forms a foundation for a feed mechanism serving to dispense web 18 from roll 17 in incremental sheet segments. While the feed mechanism could be driven by a lever or the like, it is preferably (and is shown) driven by an electric motor, generally in the manner described in copending application Ser. No. 09/081,637. In the illustrated preferred construction, the feed mechanism includes a mating feed (drive) roller 33 and pressure roller 35 which cooperate to dispense the web material. Feed roller 33 and pressure roller 35 are mounted upon axles rotatably supported at their ends by side chassis members 5, 7. Pressure roller 35 is preferably biased against feed roller 33 by a spring (not shown) to define a feed nip 37. A gear (or other drive member) secured to a drive shaft of the motor is engageable with a driven gear (or other driven member) secured to an axle of feed roller 33 to rotate the same. When web 18 is fed into nip 37, rotation of feed roller 33 causes web 18 to be advanced through nip 37, around feed roller 33. Middle chassis member 9 provides at its rear side an arcuate guide plate 39 (see FIG. 3) to direct web 18 about the rear side of feed roller 33 and into a discharge chute 41 (see FIG. 12) formed between middle chassis member 9 and a face plate structure 43 attached thereto (seen in its entirety in FIG. 2). A discharge opening 45 is formed between a bottom forward edge of middle chassis member 9 and a corresponding lower portion of face plate structure 43 (see FIGS. 22-23).

Releasable Feed Roller Drive Mechanism

Referring to FIGS. 4-8, a feed roller drive mechanism 47 according to the present invention is now described in detail. Drive mechanism 47 generally includes an electric motor 49, a drive member (in this case, a worm gear 51) and a carrier 53. Motor 49 is retained within carrier 53 and has a drive shaft 55 to which worm gear 51 is attached. Carrier 53 is pivotally connected to an outside of right side chassis member 5, in a manner permitting worm gear 51, which is also retained by carrier 53, to be moved into and out of driving engagement with a driven member (in this case, a spur gear 57) of feed roller 33. In an engagement position, worm gear 51 mates with spur gear 57 for driving the same. A worm gear/spur gear set as illustrated provides a quiet, smooth and compact output system. In addition, by its inherent design, worm gear 51 cannot be driven by spur gear 57. This one-way drive set-up advantageously avoids an overdrive of the feed mechanism due to a user pull on a leading segment of the sheet material being dispensed. Utilization of a worm gear also allows the motor drive shaft 55 to be oriented orthogonally with respect to feed roller 33, which allows for a more compact dispenser design; it also permits easy engagement/disengagement with spur gear 57. Other meshing gear sets may be used, as may other known means for transmitting rotary motion from one shaft to another, such as pressure rollers, belts, etc.

Figure 4:
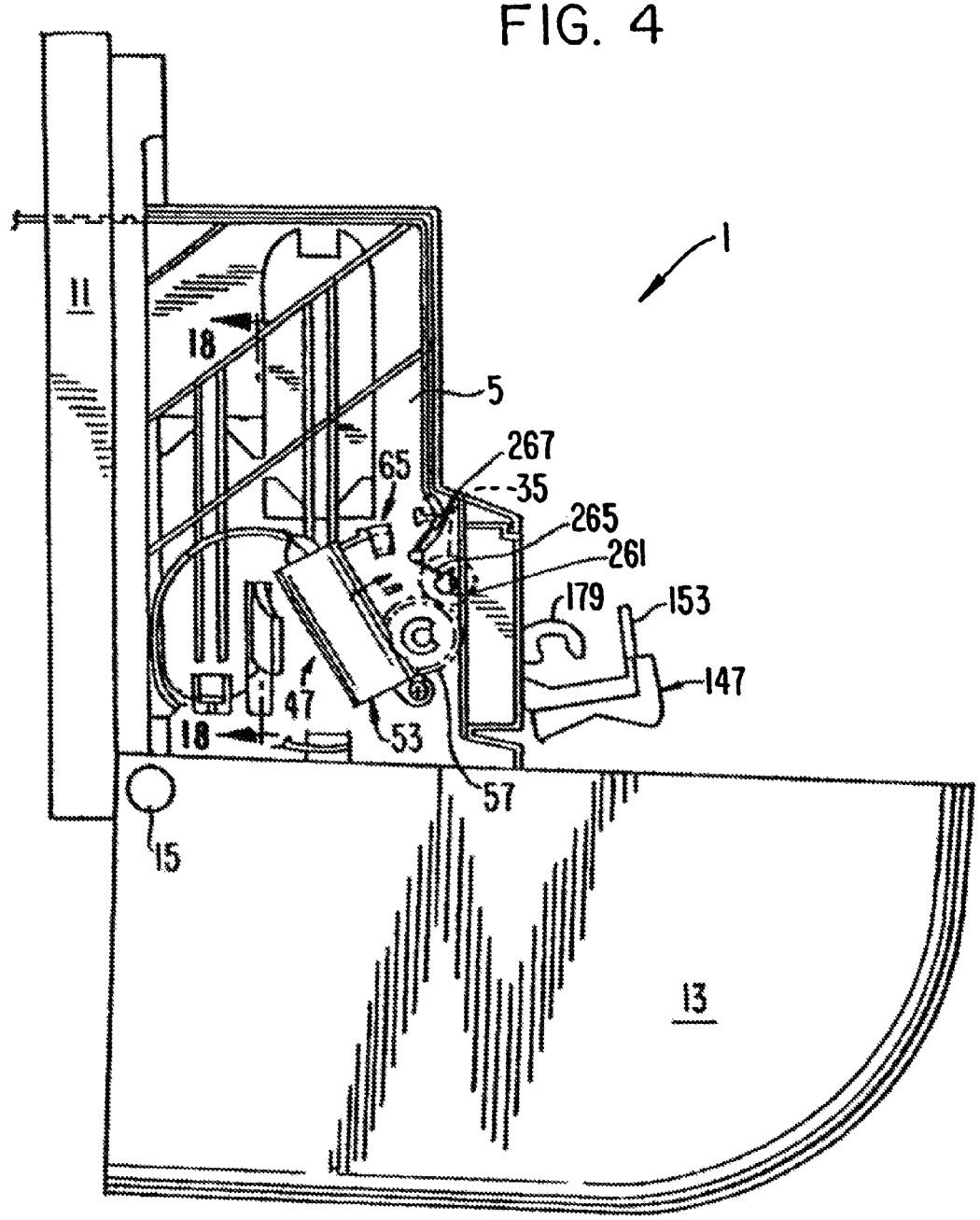
FIG. 4 is a right side elevational view of the dispenser shown in FIG. 1, with the cover thereof pivoted to an open position.

A pivotal mount of carrier 53 to right side chassis member 5 allows motor 49, drive shaft 55 and worm gear 51 to rotate as a unit into and out of driving engagement with spur gear 57, as shown by the arrow in FIG. 4. Although carrier 53 is shown pivotally attached to right side chassis member 5, carrier 53 may be translatably or otherwise movably mounted to side chassis member 5, or to other suitable structure of dispenser 1.

As best seen in FIG. 7, the pivotal carrier mount is provided by a cylindrical sleeve 59 attached to a lower forward corner of a main body portion 61 of carrier 53. Sleeve 59 extends parallel to feed roller 33, and orthogonal to drive shaft 55 and attached worm gear 51. A bolt, screw rivet or like fastener 63 is passed through sleeve 59 and connected to right side chassis member 5 to provide a carrier pivot axis extending within and along sleeve 59. Obviously, other known rotatable mounting arrangements may be used.

Figure 5:
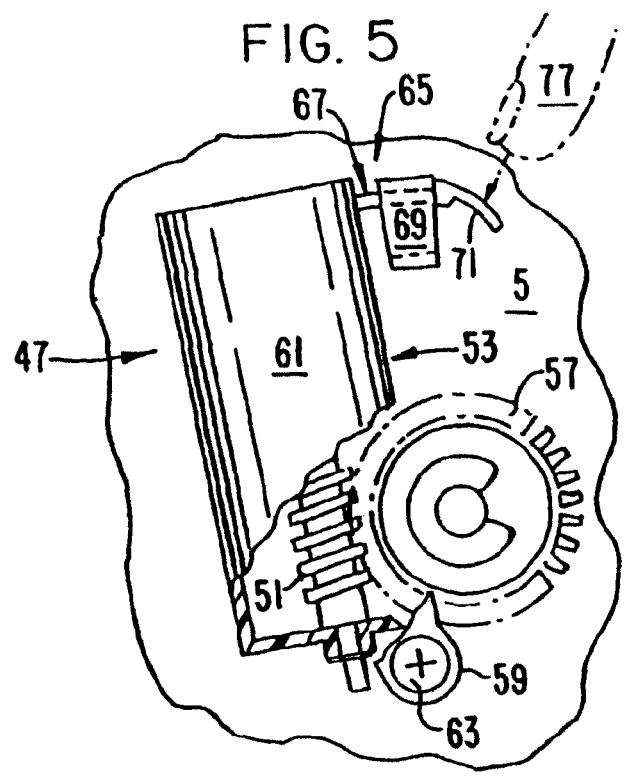
FIGS. 5 and 6 are partially broken-away close-up side elevational views of a releasable drive mechanism of the dispenser shown in FIG. 1, in engagement and disengagement, respectively, with a driven gear of a feed mechanism of the dispenser.
Figure 6:
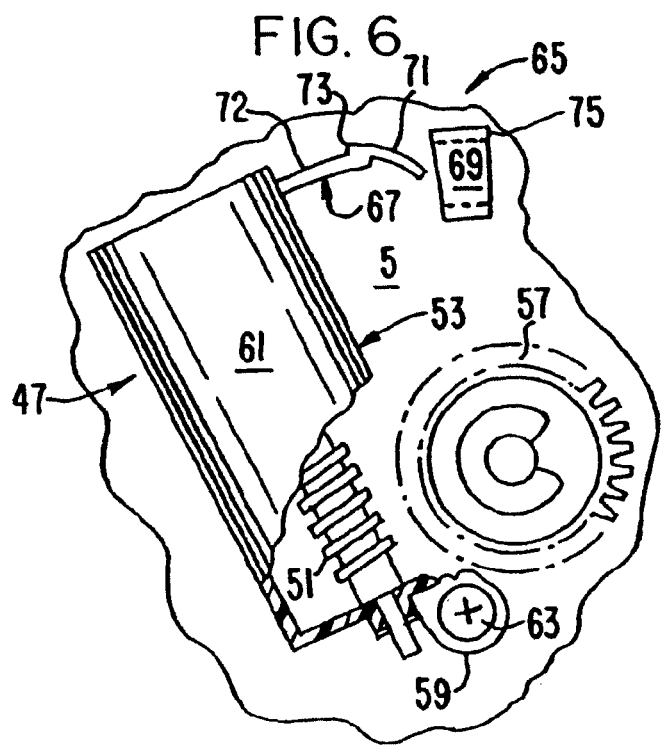

A spring clip arrangement 65 provides a releasable hold mechanism for removably holding carrier 53 in a position, as shown in FIG. 5, wherein worm gear 51 is placed in driving engagement with spur gear 57. Spring clip arrangement 65 is manually releasable (preferably finger operable) to allow carrier 53 to rotate worm gear 51 out of engagement with spur gear 57. As illustrated, spring clip arrangement 53 includes a spring arm 67 extending forwardly from an upper part of carrier body portion 61, and a stationary (female) retention clip 69 attached to an adjacent wall surface of right side chassis member 5. The free end of spring arm 67 forms a (male) catch member 71 insertable into retention clip 69. Catch member 71 is offset relative to a primary lever portion 72 of spring arm 67 so as to form at its rear side a shoulder 73. On its front side, catch member 71 arcs downwardly such that a leading edge thereof is situated below the lever portion 72.

As illustrated, female retention clip member 69 is formed as a U-shaped frame attached to side chassis member 5 to thereby form a generally rectangular opening that receives male catch member 65. As catch member 65 is advanced into female clip member 69, the upper arcuate surface of catch member 71 slidably engages the top inner surface of clip member 69. A cam action causes spring arm 67 to elastically deflect downwardly, thereby permitting catch member 71 to continue to advance into clip member 69. Once fully inserted, an upper downstream edge 75 of the rectangular frame acts as a latch surface that engages with shoulder 73. This engagement may be readily manually released by an attendant using his/her finger 77 to press downwardly on male clip member 69, to thereby elastically deflect spring arm 67 downwardly. As shown in FIG. 8, a scored, knurled or otherwise textured surface can be provided on the top side of catch member 71 to increase the friction between a pressing finger and catch member 71 to thereby facilitate a releasing displacement of spring arm 67.

Referring to FIG. 7, carrier body portion 53 defines a motor chamber 79 and a drive member chamber 81. A dividing wall structure 83 separates the two chambers and has a hole 85 formed through it. Drive member chamber 81 is defined between dividing wall structure 83 and an opposite end wall structure 87. A second hole 89 is formed in end wall structure 87, in alignment with hole 85. Drive shaft 55 extends through, and is rotatable within, aligned holes 85 and 89. Dividing wall structure 83 and end wall structure 87 thus serve to rotatably support drive shaft 55. Motor 49 and drive shaft 55 may be restrained from backing out of carrier 53 by suitable means such as an e-clip 91 or other retention device fixedly secured on the end drive shaft 55, outside of (and below) end wall structure 87.

Worm gear 51 is coaxially fixed on motor drive shaft 55 between dividing wall structure 83 and end wall structure 87. To permit driving engagement of worm gear 51 and spur gear 57, the sidewall wall structure defining drive member chamber 81 forms a side port 93 sized and positioned to allow ingress and egress of a portion of spur gear 57 to/from carrier 53 as carrier 53 is rotated into and out of its engagement position.

Releasable drive mechanism 47 facilitates the clearing of jams that may occur in operation of dispenser 1, by permitting ready disengagement of feed roller 33 from motor 49. This functionality is accomplished with a simple structure having few parts, which are easily assembled. Carrier 53 may be injection molded as a unitary thermoplastic component. Motor 49, drive shaft 55 and worm gear 51 are readily engaged with each other and within carrier 53 to complete the mechanism.

An attendant can readily disengage drive mechanism 47 by pressing downwardly on catch member 71 to deflect spring arm 67 such that catch member 71 is released from retention clip 69. Carrier 53 is then pivoted such that worm gear 51 moves out of engagement with spur gear 57. The attendant may then rotate feed roller 33 and/or pressure roller 35 as necessary to clear a jam. Once the jam is cleared, dispenser 1 may be restored to an operative state by simply re-engaging worm gear 51 with spur gear 57, by rotating carrier 53 in the opposite direction until catch member 71 is reengaged with female clip member 69. In contrast, with known motorized dispensers lacking provision for ready disengagement of the drive motor from the feed roller, jams must be removed with the motor engaged, or a complicated procedure must be undertaken to disengage the drive motor and feed roller. Left engaged, a drive motor may impart significant additional drag inhibiting free rotation of the feed roller. As a result, manual rotation of the feed roller to remove a jam of web material may be rendered more difficult. As previously explained, utilizing a worm gear in the drive train as in the present system precludes manual rotation of the feed roller without disengagement of the drive motor.

Power Supply System

Figure 9:
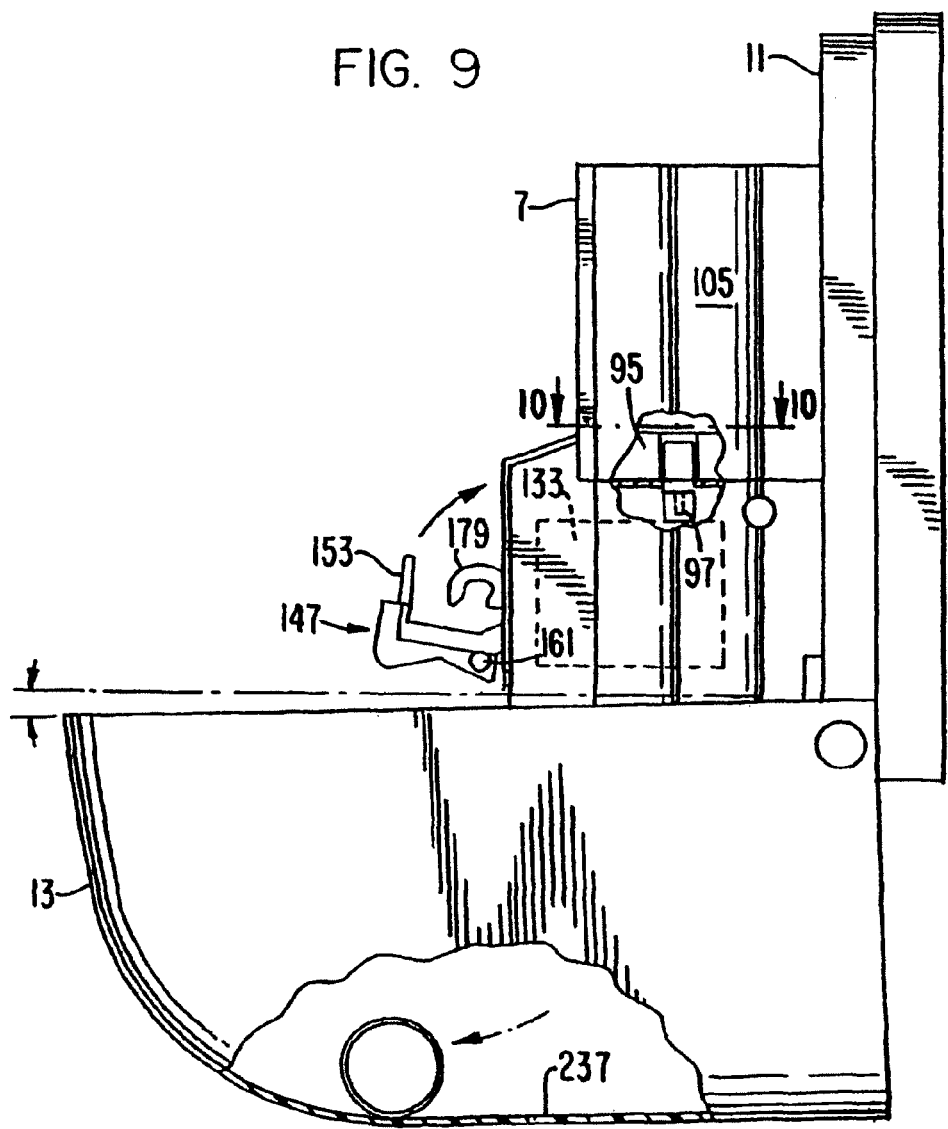
FIG. 9 is a partially broken-away left side elevational view of the dispenser shown in FIG. 1, with the cover thereof pivoted to an open position and a roll core contained within the cover.
Figure 10:
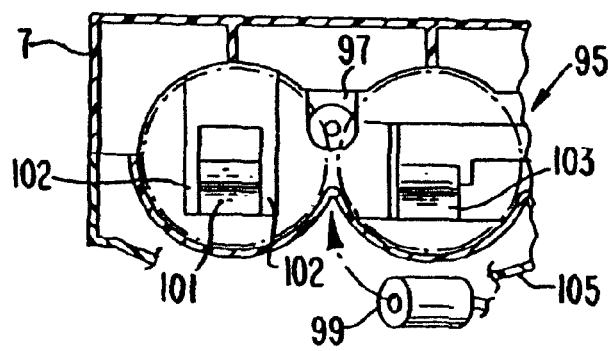
FIG. 10 is a cross-sectional view taken on line 10-10 in FIG. 9, illustrating an inventive power line input port/battery compartment lock-out arrangement.

Referring now to FIGS. 9-10, a power supply system of dispenser 1 includes a battery compartment 95 and a power line input port 97. Power line input port 97 and battery compartment 95 are configured to provide power to the electrical systems and components of dispenser 1, to the mutual exclusion of each other. Specifically, battery compartment 95 can only receive a full complement of batteries (to complete a power supply circuit) when power line input port 97 is not connected to a power line/plug 99. Conversely, power line input port 97 can only receive a power line plug 99 when battery compartment 95 is not fully loaded and operational.

As shown, battery compartment 95 is integrally formed as part of left side chassis member 7 to receive standard size batteries, e.g., D-size dry cells, arranged in a series connection between a pair of terminals 101, 103. The compartment is closeable by way of a removable cover 105. Power line input port 97 is located directly adjacent to battery compartment 95, at a lower side thereof. Access to port 97 is provided, preferably exclusively, through (from the inside of) battery compartment 95. In the illustrated exemplary embodiment, power line input port 97 is a conventional DC input jack designed to receive output plug 99 of a conventional AC/DC power converter (adapter).

In accordance with the invention, power line input port 97 is configured relative to battery compartment 95 such that a power line 105 when extending to plug 99 is engaged with power line input port 97 extending from plug 99 naturally occupies a portion of battery compartment 95 and thereby precludes insertion of one or more batteries into the compartment. Conversely, when battery compartment 95 is fully loaded with batteries, access to power line input port 97 is blocked and port 97 is prevented from being connected to power plug/line 99, 105.

The above-described power supply arrangement of dispenser 1 provides a facility owner/operator with the option to choose two dispenser power sources—battery and line power. This allows greater flexibility in the use and location of the dispenser. At the same time, potential damage to or malfunction of the dispenser electronics or alternative power supplies, due to inadvertent simultaneous connection of the alternative power supplies in parallel with each other, is avoided. A reliable power lock-out functionality is provided with a simple and inexpensive mechanical arrangement.

As a further safeguard, battery compartment 95 and selected terminals thereof may be configured to prevent connection of the batteries with the wrong polarity. For example, terminal 101, if set to be a positive terminal, may be inset slightly relative to adjacent flanking shoulders 102 such that only the protruding positive terminal of the battery (e.g., D-size dry cell) will make contact with terminal 101. If the battery is inserted with the wrong (reverse) orientation, the flat negative battery terminal will abut against shoulders 102 and remain spaced from (and out of electrical contact with) terminal 101. Similar terminal arrangements may be provided at any of the other positive terminals within battery compartment 95.

Dispenser Set-Up and Dispensing Control

Upon engagement of drive mechanism 47, and the provision of power (via battery compartment 95 or power line input port 97), dispenser 1 need only be loaded with a roll of the sheet material to be readied for use. As with the dispenser described in application Ser. No. 09/081,637, dispenser 1 is preferably used for dispensing from a roll of web material having spaced apart tearing lines, such as prescored lines of perforation, resulting in sheet segments of a desired length, e.g., nine inches. By using a pre-perforated web material, the sheet segments can be easily separated from the web without requiring cutting. The perforation tensile strength can be made light enough such that the web material can be easily separated along the perforation lines. By power feeding web 18 and providing pre-formed tear lines, the web does not need to have sufficient strength to draw out additional portions as a leading portion is removed (as required by many known dispensers), and less pull force is required to detach a leading segment. Thus, the paper or other material of which the web is made can be better optimized for softness and absorbency.

When a roll 17 (see FIG. 1) is initially loaded into dispenser 1, the leading edge of web 18 may be manually fed rearward into feed nip 37 formed between feed roller 33 and pressure roller 35. Preferably, however, a feed transfer mechanism (as will be described) is utilized, such that it is only necessary for the attendant to place a leading edge portion of the web in a cradle 107 formed by face plate structure 43 (see FIGS. 1 and 23). When front cover 13 is closed, a cover switch 109 (see FIGS. 1 and 20) may be engaged to activate drive mechanism 47 and automatically drive feed roller 33 in a direction (i.e., counterclockwise as viewed in FIG. 4) to advance the web around feed roller 33 and into discharge chute 41 (see FIG. 12) formed below feed roller 33, between middle chassis member 9 and face plate structure 43.

In the event a feed transfer mechanism is utilized, closure of cover 13 may also actuate the feed transfer mechanism, to press a leading edge portion of web 18, which is draped over feed nip 37 and retained in cradle 107, into feed nip 37 as feed roller 33 is driven by drive mechanism 47. The leading edge of web 18 is advanced, and ultimately detected by one or both of a pair of towel sensors 111, 113 (see FIGS. 11-13) positioned to sense the presence of sheet material in discharge chute 41. Sensors 111 and 113 are coupled with a microprocessor 115 (see FIG. 20) forming part of a micro-controller or the like, which is programmed to detect as a leading edge of dispensed web material, a transition from a web absent to a web present condition. Once a leading edge has been detected in this manner, microprocessor 115 causes drive mechanism motor 49 to continue to run for a second interval, initialized at the point of leading edge detection, to dispense a predetermined length of towel. Removal of the leading sheet segment places a next leading edge of web 18 in discharge chute 41, downstream of the feed mechanism, but upstream of sensors 111, 113. While the sensors could be any one of a variety of suitable mechanisms, for example, mechanical limit switches or acoustical sensors, the illustrated preferred embodiment utilizes a pair of optical sensors 111, 113, each comprising an emitter 115 and a photo-detector 117, e.g., a photo-diode or phototransistor (see FIG. 12). Light emitted from emitter 115 is reflected and received by associated photo-detector 117 in a certain intensity when web material is present. This intensity is reflected in the output signals of the photo-detectors 117, which are supplied to respective input pins of microprocessor 115.

Figure 12:
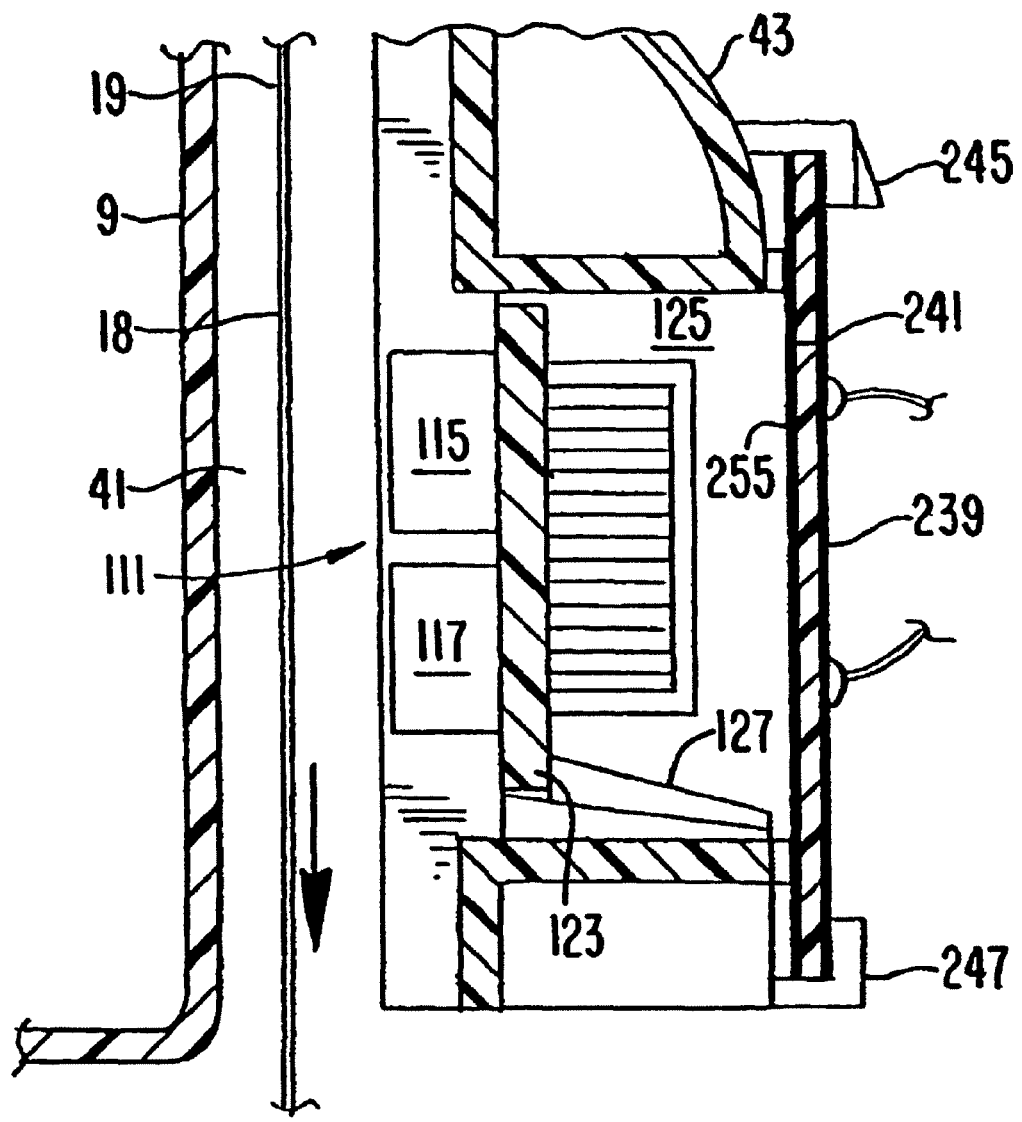
FIG. 12 is a cross-sectional view taken on line 12-12 in FIG. 11, showing a discharge chute of the dispenser.
Figure 23:
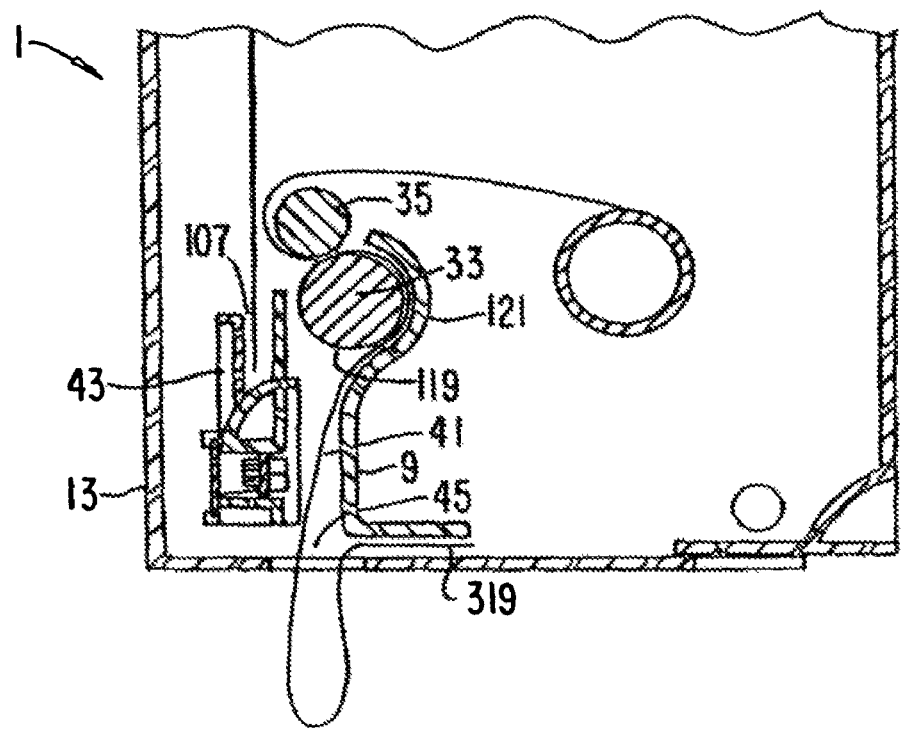
FIG. 23 is a diagrammatic side elevational view of the dispenser of FIG. 1, illustrating a loop of sheet material generated upon cover closure, in accordance with one of the present inventions.

Referring to FIGS. 12 and 23, discharge chute 45 preferably defines an access that is narrow enough to prevent a user's fingers from reaching a free leading edge of web 18 located therein, e.g., while dispenser 1 is waiting for a sheet request signal generated by a user proximity sensor (to be described). Sensors 111, 113 are located in discharge chute 41 between discharge outlet 45 and the upstream blind end 119 (see FIG. 23) of chute 41 defined by a feed-through formed between feed roller 33 and an arcuate guide plate 121 of middle chassis member 9. With this arrangement, towel sensors 111, 113 are substantially shielded from ambient light and potential interference caused thereby. Adverse effects caused by ambient light can be further minimized by pulsing the emitter and high-pass filtering the output of the photo-detector, under the control of microprocessor 115. In conjunction with pulsing the emitter, microprocessor 115 can be used to carry-out known synchronous detection techniques to further filter out any motor brush and optical noise from the photo-detector output, which may not be removed by the high-pass filtering. Such a technique may involve subtraction of a value representative of a photo-detector On time when the emitter is Off, from a photo-detector On time when the emitter is pulsed On. This can be done digitally, by decrementing and incrementing a stored count value, or using analog techniques, e.g., by charging and discharging a capacitor.

By appropriately controlling the feed of web 18, successive perforation lines 19 are located in discharge chute 41 such that each leading sheet segment can be torn away from the remaining web 18, leaving a new free leading edge (formerly an intact perforation line 19) slightly above the towel sensing location of sensors 111, 113. The (new) free leading edge will remain there until the next dispensing operation is carried out. As mentioned, this may be upon receipt by microprocessor 145 of a sheet request signal generated by a user proximity sensor (to be described). Alternatively, in a "sheet hanging" mode, a sheet segment may be immediately dispensed upon the sensing of an absence of sheet material in the discharge chute, by sensors 111, 113. Either way, towel sensors 111, 113 will register the position of the leading edge shortly after the feed mechanism starts feeding sheet forward, and before a second predetermined interval of advancement is carried out. As an alternative to carrying out the first interval of advancement as a first step upon receipt of a sheet request, the first interval may be carried out immediately following removal of a sheet segment dispensed in a preceding dispense cycle. In this case, the free leading edge begins the second predetermined interval of advancement immediately upon receipt of a sheet request signal, initialization of the leading edge having been previously performed.

In lieu of triggering a second predetermined interval of advancement by the direct sensing of a segment leading edge (free or otherwise), one or more web sensors could be utilized to detect indicia (e.g., a mark or the like) located in relation to a leading edge. In this case, detection of the indicia by the sensor(s) would indicate arrival of the leading edge at a first position spaced from the sensor, marking the end of the first interval of advancement and the beginning of the second predetermined interval of advancement.

As a further variation, a dispense cycle may comprise an interval of sheet advancement and a sheet retraction interval. More specifically, a first interval of advancement may be used to dispense a leading segment and to place the adjacent tear line downstream of the sensor(s) a short distance. Once the leading segment is removed, an interval of retraction may begin and continue until the sensor(s) detect the free leading edge (e.g., as a transition from a web present to a web absent condition). This interval of retraction serves to initialize the start of the next interval of advancement, to be carried out in a subsequent dispense cycle. In this embodiment, a switch or sensor separate from sensors 111, 113 may be used to detect removal of the leading segment by a user, and control circuitry/logic may be provided for providing alternating forward and reverse drive cycles of feed roller drive motor 49.

Dispensed web exits discharge chute 41 through discharge outlet 45 where it hangs externally of dispenser 1. A user may grasp the dispensed sheet segment and pull on it, causing it to tear off along the adjacent perforation line 19 (see FIG. 1) positioned upstream of sensors 111, 113. This returns sensors 111, 113 to a web absent condition. If a sheet segment is dispensed, but the user does not remove it, sensors 111, 113 will ordinarily both detect the presence of web 18. In this case, microprocessor 115 will preferably prevent further activation of motor 49. Such feed inhibition serves to discourage abusive excessive dispensing, as well as to prevent potential inadvertent triggering of a dispensing operation, e.g., as a result of spurious signals generated by a user detection sensor (and interpreted as a sheet request signal). In addition, energy savings may be realized by activating and monitoring (e.g., polling) the user detection sensor only when sensors 111, 113 indicate a web absent condition. The pair of sensors 111, 113 spaced across the width of web material 18 are advantageously utilized to cause activation of motor 49 to carry out a dispense cycle in the event the leading towel segment is irregularly torn apart from the tearing line, uncovering only one of the two towel sensors. In lieu of a pair of spaced sensors 111, 113, a single centrally positioned sensor may be provided in discharge chute 41.

Figure 11:
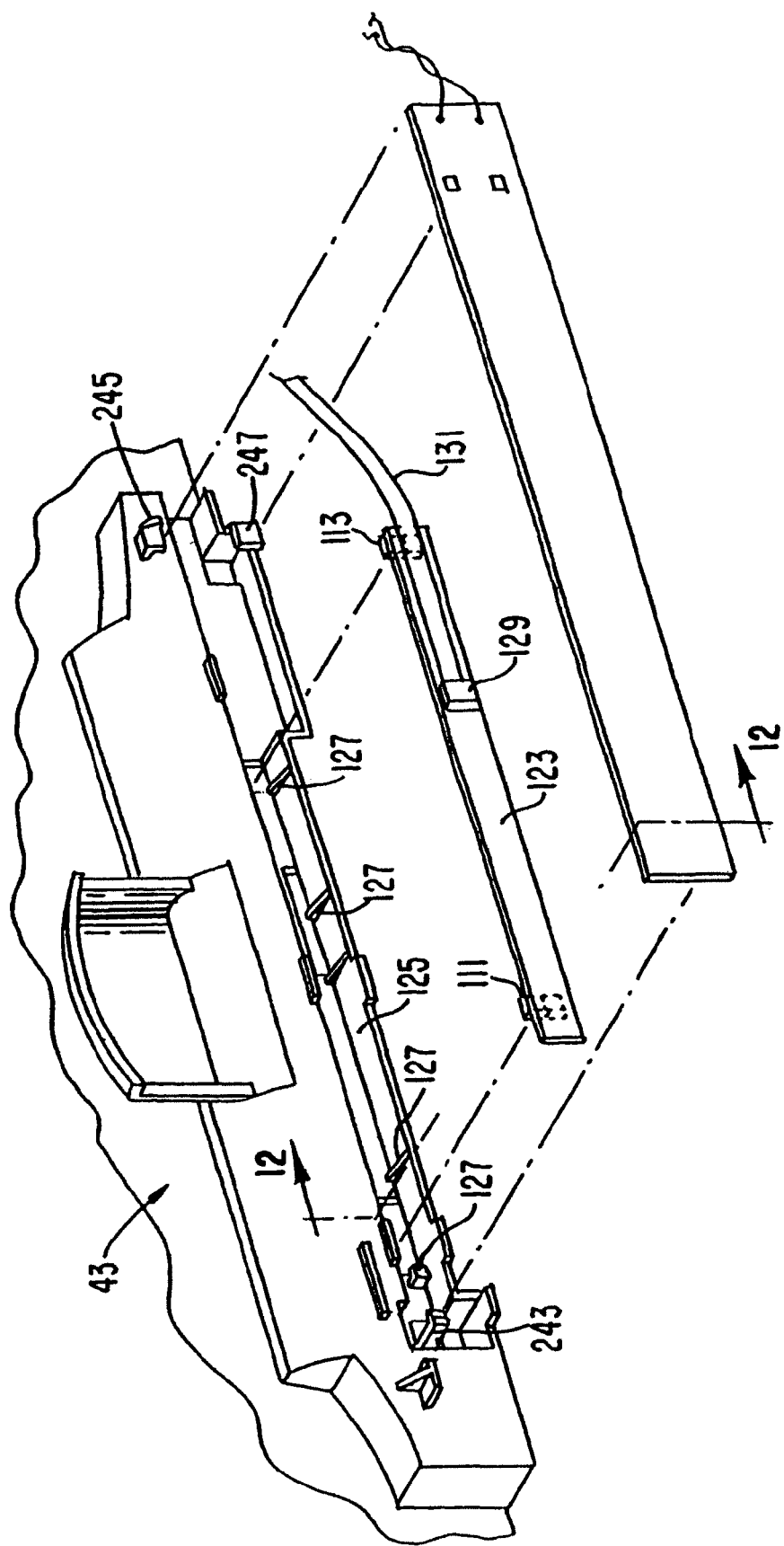
FIG. 11 is an exploded view of a front shield assembly of the dispenser shown in FIG. 1, including overlying printed circuit boards providing, respectively, mounting surfaces for a pair of sheet detection sensors, and a proximity sensing system antenna.

With reference to FIGS. 11-12, sensors 111, 113 are mounted on an elongated printed circuit board (PCB) 123 that clips into and out of a seat defined within a recess 125 of face plate structure 43. PCB 123 is retained within recess 125 by a plurality of bosses 127. Sensors 111, 113 are mounted to face discharge chute 41, adjacent opposite ends of PCB 123. Apertures are provided in the floor of recess 125 at positions corresponding to sensors 111, 113, to provide windows through which the sensors may "look" into discharge chute 41. Signal lines (not shown) extend from sensors 111, 113 to a connector 129 attached to the end of a ribbon cable 131 that extends to a main circuit board 133 (see FIGS. 2 and 9).

As mentioned, microprocessor 115 preferably controls dispenser 1 to feed a sheet segment only after detecting that a previously fed sheet segment has been separated from the remaining web 18 (and, optionally, only after receipt of a sheet request signal from a switch or sensor). To control the amount of web 18 fed so that only one sheet segment is fed per dispense cycle, and to assure a proper placement of successive tear lines in discharge chute 41, dispenser 1 employs a displacement detector 135 (see FIG. 20), the output of which can be used to establish a predetermined interval of web feed during each dispensing cycle, i.e., each time motor 49 is activated. Displacement detector 135 may be a shaft encoder, either electromechanical or optical, mounted to generate a pulse for each small increment of rotation of feed roller 33. In the illustrated exemplary embodiment, an optical shaft encoder comprises a slotted wheel 137 mounted on an axle 139 of feed roller 33, in overlying relationship with main PCB 133 retained within left side chassis member 7. A sensor (emitter-photo-detector pair) of the encoder may be mounted on PCB 133 so as to output a pulse train corresponding to rotation of the wheel slots past the sensor. An alternative to encoding successive incremental displacements of feed roller 33 is to detect the difference in transmissivity of web 18 when a perforation line 19 crosses an optical interrupter. That is, an emitter-photo-detector combination may be used to provide a signal that indicates a first level of light reception as web is fed, and a second level when a perforation line crosses the light path. A pulse may be generated by the presence of the perforations.

Microprocessor 115 preferably will count the pulses generated by sheet displacement detector 135 starting from the point at which a leading edge is detected by microprocessor 115 (e.g., as transition from a web absent to a web present condition). Dispenser 1 may be set to dispense from rolls with sheet segments of various length. For instance, with perforated tear lines spaced nine inches apart, microprocessor 115 counts the corresponding number of pulses to dispense nine inches of web 18. A switch, dial, button or other means may be provided to adjust the displacement per dispensing cycle to accommodate rolls having different segment lengths, and/or to cause dispensing of multiple sheet segments, if desired. Although, other counting arrangements, or a time based dispense cycle, could be used for controlling the dispense interval, calculation of sheet displacement from a detected leading edge is preferred to avoid cumulative error, i.e., error accumulated over a series of consecutive dispense cycles. Such cumulative error could result in misplacement of a tear line for a leading segment, either downstream of sensors 111, 113, or upstream of blind end 119 (see FIG. 23) of discharge chute 41, thus resulting in a system fault condition.

"Overshoot" may occur following an On-interval of motor 49, due to inertia of the feed mechanism. To avoid this potential problem, conventional circuitry/logic can be provided to directly short the power terminals of the motor at the end of each operation interval, to thereby provide a known dynamic braking effect.

As a further protective measure, microprocessor 115 may be programmed to compensate for any overshoot that does occur, by subtracting from the desired displacement amount a predicted or anticipated overshoot amount. An appropriate value may be obtained from historical data representative of overshoot amounts measured as the number of encoder pulses occurring after power-down of the motor, e.g., a moving average value. For example, a memory may store, for a predetermined number of recent dispense cycles, a moving average of the number of counts of displacement detector 135 occurring after power-down of motor 49. As a further example, an updated running average value may be maintained by a recursive calculation averaging a most recent overshoot count value with a preceding average value (which itself was calculated by averaging the penultimate count value with a preceding count value, etc.) The running calculation may be initiated upon power-up of the dispenser or closure of cover 13, and may continue until operation of the dispenser is interrupted, e.g., by opening of the cover or battery depletion. A starting "average" value (for use in the initial dispense cycle) may be chosen based upon empirical data.

Figure 13:
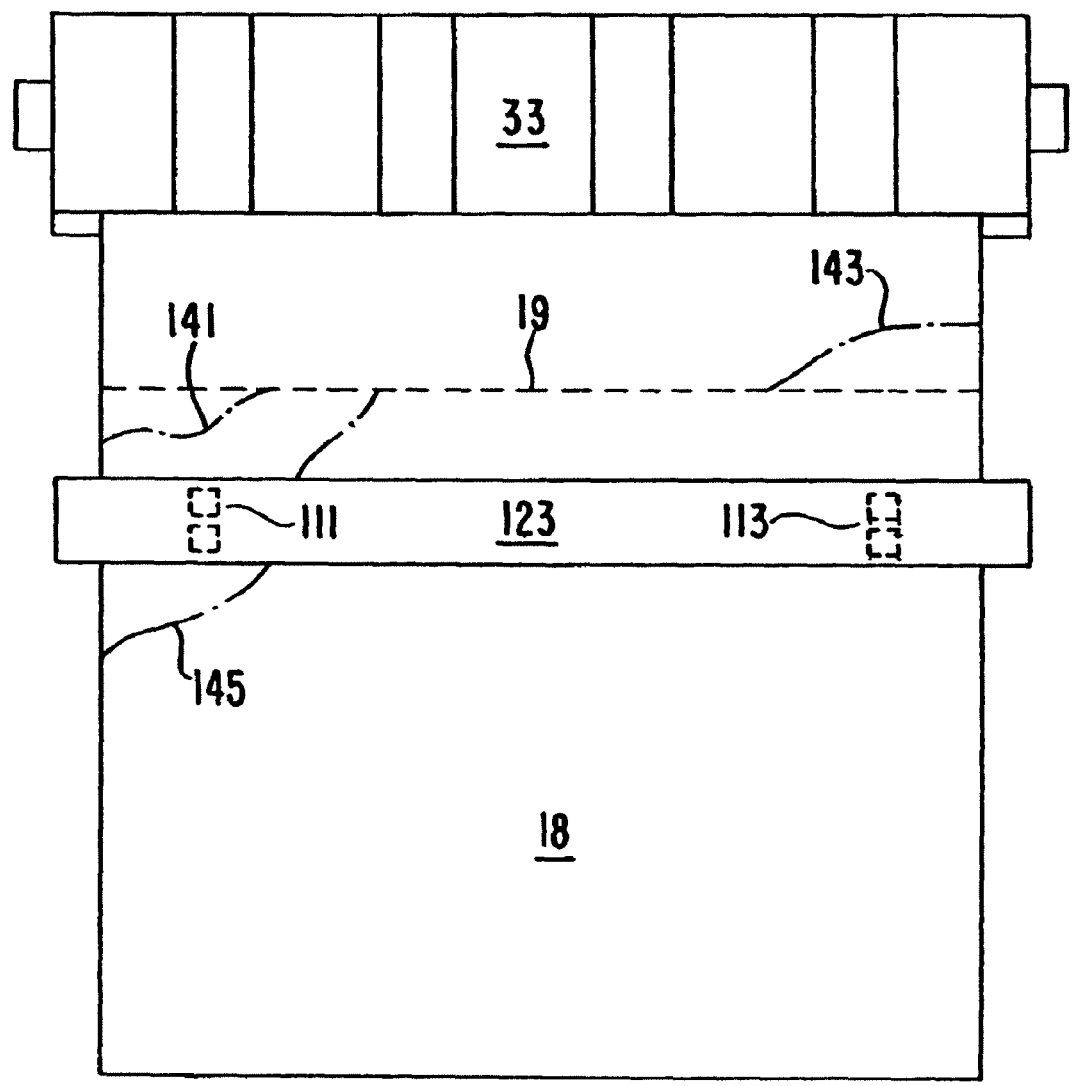
FIG. 13 is a diagrammatic front elevational view of a leading segment of sheet material extending within the discharge chute of FIG. 12 and out of the dispenser, illustrating various "tabbing" scenarios.

Accommodation of "Tabbing" With reference now to FIG. 13, it is explained how the web sensing system of dispenser 1 may handle various possible scenarios in which tearing occurs other than strictly along tear line 19. Broken lines 141 and 143 both depict internal "tabbing" tears, that is, tears that result in an irregular tab of web material 18 remaining wholly within discharge chute 41, upstream of sensors 111, 113. Broken line 145 depicts an external "tabbing" tear, wherein an irregular tab of web material extends over at least one of sensors 111, 113 (and generally outside of discharge chute 41). Through utilization of two spaced sensors 111, 113, and as has been described, removal of a leading segment can be detected notwithstanding this external tabbing condition, by sensing the absence of web material at either one of the two sensors.

Tear line 141 may be said to result in downstream internal tabbing, in the sense that the irregular tab that results is downstream of tear line 19 (yet still upstream of sensors 111, 113). Tear line 143 may be said to result in upstream internal tabbing, in the sense that the irregular tab that results is upstream of tear line 19. With a single centrally located web sensor, these two scenarios would not cause a problem, as the sensor would be positioned to detect the tear along tear line 19 as the leading edge, and initialize further feed from that point. On the other hand, these conditions may cause a problem when a pair of spaced sensors, such as sensors 111, 113, are utilized, in that detection of a leading edge will occur along the irregular tear line 141 or 143 downstream or upstream of tear line 19, with the result that the initialization of sheet feed occurs either upstream or downstream of tear line 119; such improper initialization would result in successive misplacement of subsequent tear lines.

A "first edge detection" system may be employed to avoid a dispenser fault condition arising as a result of upstream internal tabbing. In this system, microprocessor 115 initializes a second interval of advancement based upon the first edge detected by sensors 111, 113, on the assumption that the first detected edge is an edge formed along tear line 19. Tabbing that occurs downstream of tear line 19 is generally of the "external" kind illustrated with line 145, leaving a tab which extends externally of discharge chute 41, or at least downstream of one of sensors 111, 113, such that the sensor at the tabbed side continues to detect the presence of web material. In this instance, and as has been described, the uncovering of at least one of sensors 111, 113 (sensor 113 as illustrated in FIG. 13) signals removal of a leading segment of sheet material, satisfying a web absent condition for microprocessor 115 to initiate a dispense cycle. Upon initiation of a dispense cycle, initialization of the dispense counter (for starting the second interval of advancement) occurs upon the same sensor detecting a leading edge.

In accordance with one of the present inventions, microprocessor 115 may be programmed to avoid the above-mentioned initialization problem that may arise as a result of the internal tabbing scenarios depicted by tear lines 141 and 143. A memory may store a nominal measure of the first interval of sheet advancement. This may be a constant value, e.g., set to correspond to one half the distance between the blind upstream end 119 of discharge chute 41 (see FIG. 23) and sensors 111, 113. Alternatively, the memory may store, for a predetermined number of recent dispense cycles, a moving average of the number of counts of displacement detector 135 occurring from activation up to the point that a leading edge is detected (the first variable interval of advancement). The moving average may be computed by other known techniques, such as recursively in the manner previously described in connection with prediction of a feed mechanism overshoot amount. The nominal value (e.g., a set value or a moving average value) may then be compared against the count corresponding to a first edge detection by one of sensors 111, 113. If the latter count differs significantly from the nominal value, then it may be concluded that the detected edge is a bad edge, i.e., one not along tear line 19, in which case microprocessor may similarly validity check the count corresponding to a second edge detection by the other sensor. If the comparison shows that detection to be valid, then initialization may be properly carried out from that point. If neither sensor sees a good edge, then initialization of the dispense cycle may be carried out at a point corresponding to the stored nominal value. In this manner, successive placements of tear lines 19 may be properly maintained within discharge chute 41, upstream of sensors 111, 113, thereby avoiding a dispenser fault condition.

If a user pulls on the leading edge of the sheet segment being dispensed before the cycle has been completed, motor 49 may stall due to the increased load placed on worm gear 51. (As mentioned, worm gear 51 cannot be reverse driven by spur gear 57; thus, a user pull will not cause motor 49 to accelerate.) Web 18 generally will be prevented from slipping about feed roller 33 when pulled because of the pinching engagement of feed nip 37. When the motor stalls, microprocessor 115 may store the cumulative displacement (to the point of the stall) and reactivate motor 49 to dispense the remaining portion of the sheet segment after a short pause. Alternatively, motor 49 may be reversed so that the sheet segment is pulled upstream of towel sensors 111, 113 and fed forward again to register the leading edge again in preparation for a new dispensing cycle.

Dispenser Feed Transfer Mechanism

As previously mentioned, web 18 may be introduced into the feed mechanism by a transfer mechanism. With reference to FIGS. 1, 2, 4, 9 and 14-15, the transfer mechanism may include a transfer bar 147 pivotally mounted between side chassis members 5, 7 and a transfer drive system 149 for driving transfer bar 147 by way of an electric transfer motor 151 located within left side chassis member 7. Transfer drive system 149 utilizes a series of linkages to convert rotation of the output shaft of transfer motor 151 to pivotal movement of transfer bar 147, and fingers 153 thereof, in the direction of feed nip 37, to position a leading portion of web 18 in nip 37 while feed roller drive motor 49 is being operated. Similar to drive motor 49, transfer motor 151 preferably has low DC power requirements and is powered by batteries loaded in compartment 95, or by a line/plug connected to power line input port 97. Obviously, a separate power supply for motor 151 could instead be provided.

Under the control of microprocessor 115, transfer motor 151 is preferably activated in response to a determination being made either that a working roll is not present, or that one that is present is completely depleted. Such a determination may be made using sensors 111, 113 to detect the presence or absence of web 18 within discharge chute 41. If a web absent condition is detected and sustained for a predetermined operation interval of drive motor 49, this is indicative of the working roll being depleted, or the absence of one in the dispenser. Under this condition, transfer motor 151 is activated to carry out a first transfer attempt. If the first transfer attempt does not result in detection by sensors 111, 113 of web material in discharge chute 41, a second transfer attempt is preferably carried out. If, after the second transfer attempt, web material is still not detected, it may be assumed that a reserve roll (to which feed would ordinarily be transferred) is not present in upper roll support hubs 21, 27. Accordingly, an alarm or indicator, such as a flashing LED 154 (see FIG. 1) may be activated to alert the attendant to the need to replenish the dispenser with roll material.

To facilitate maintenance of a reserve roll in dispenser 1, a sensor can be provided to detect when a working roll held in the upper pair of supports 21, 27 has been depleted sufficiently for it to be moved to lower pair of supports 29, 31. In one embodiment, and as shown in FIG. 1, this sensor is provided in the form of a pivotal arm 155 lightly spring-biased against the outer circumference of the roll placed in the upper pair of support hubs 21, 27. Arm 155 may have a pivotal attachment 157 to back panel member 11, and be positioned to actuate a switch that changes state (e.g., closes) when the diameter of the roll is reduced to a certain extent, to activate LED indicator 154. The switch may, e.g., be incorporated into left side chassis member 7. Alternatively, in accordance with one of the present inventions, program logic can be used in conjunction with microprocessor 115 to determine when the roll has been depleted sufficiently for it to be transferred to lower pair of supports 29, 31. For example, the amount of roll depletion may be determined by subtracting a cumulative dispense amount (e.g., calculated from the output of displacement detector 135) from a stored initial nominal roll length. LED indicator 154 may be activated upon the calculated roll depletion reaching or exceeding a stored target transfer value.

Figure 14:
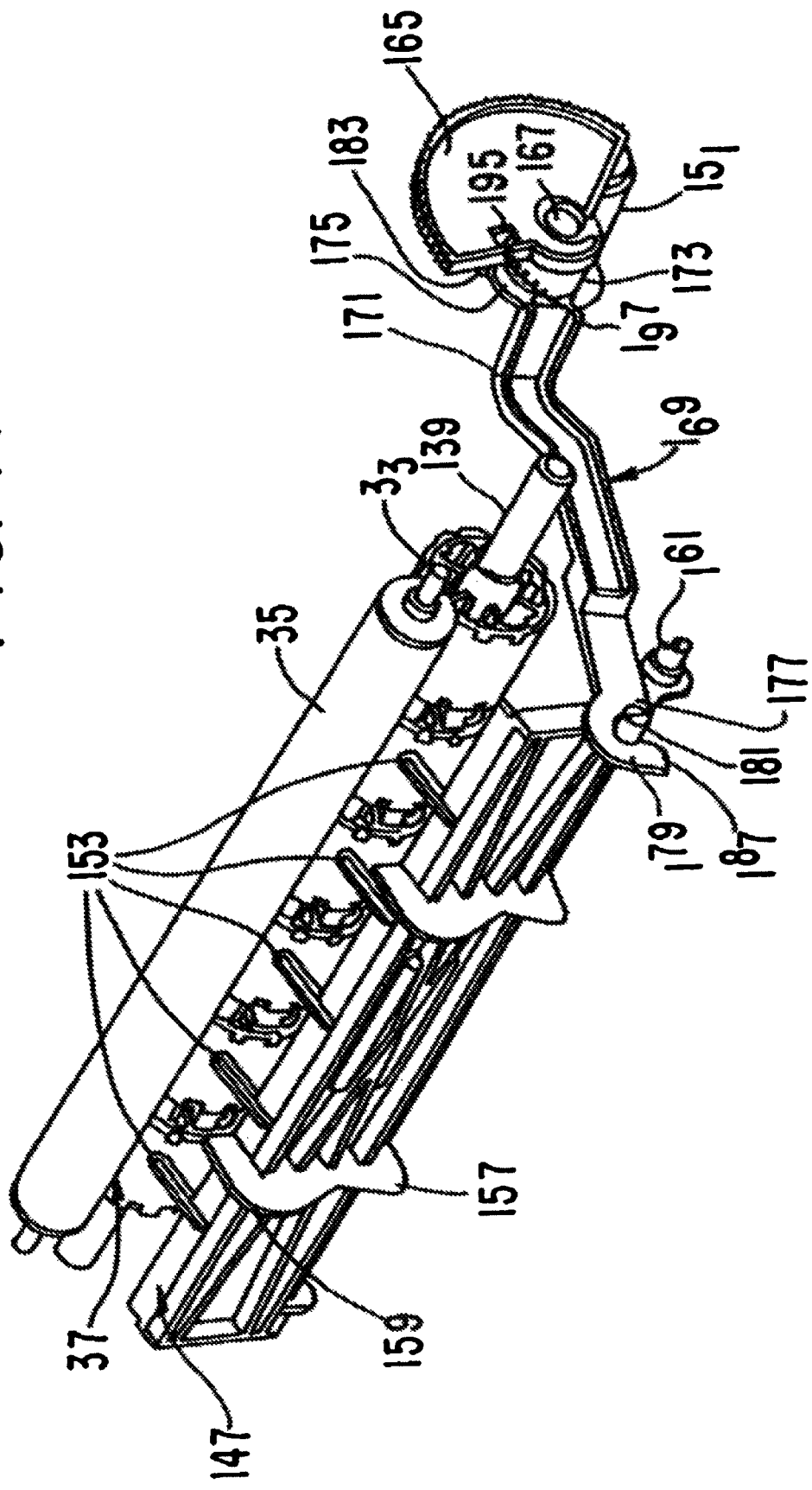
FIG. 14 is a perspective view showing, a powered web feed transfer mechanism of the dispenser of FIG. 1 in relation to the feed and pressure rollers of the dispenser.

As best seen in FIG. 14, transfer bar 147 is an elongated member having a plurality of cross braces that provide extra rigidity. Transfer bar 147 is pivotally connected to side chassis members 5, 7 and extends between those members along the length of feed nip 37. Transfer bar 147 also includes cover engaging members 157 having rounded upper shoulders 159 that will slide smoothly along the inside of front cover 13, as cover 13 is closed. Ultimately, engaging members 157 will rest against the inside of a front panel of cover 13 to place transfer bar 147 in the set, transfer ready position depicted in FIG. 15.

A pair of sleeve bearings formed at opposite sides of face plate structure 43 pivotally support respective stub shafts 161 protruding outwardly from opposite ends of transfer bar 147. This pivotal mount permits transfer bar 147 to rotate (counterclockwise in FIG. 15) when cover 13 is pivoted to an open position. In this manner, transfer bar 147 and cover 13 can both rotate to respective web loading positions, e.g., as shown in FIGS. 1 and 4, in which they are conveniently out of the way of the attendant loading the dispenser. The pivotal mount also permits transfer bar 147 to rotate about shafts 161 in the direction of nip 37 (clockwise in FIG. 15) when the transfer drive mechanism is activated, as discussed below.

Rigid transfer fingers 153 are placed along the length of transfer bar 147 for engaging web 18 and positioning it in the nip 37 formed by feed roller 33 and pressure roller 35. The number of transfer fingers 153 can be varied depending on the length of the transfer bar and/or the strength of the web to be dispensed. With a relatively weak web material, a closer spacing of the transfer fingers can be used to reduce stress concentrations at the transfer finger contact points, so as to avoid web perforation or tearing. As shown, e.g., in FIG. 15, fingers 153 extend away from the transfer bar in the direction of nip 37. These fingers 153 include rounded web contacting ends that are directed at nip 37 when transfer bar 147 is in its set position. The forward edge of each finger 153 is rounded and sized so that it will engage and position web 18 between the rollers 33, 35 without tearing or perforating the web, when transfer bar 147 is advanced from the set position to the web transfer position.

Figure 15:
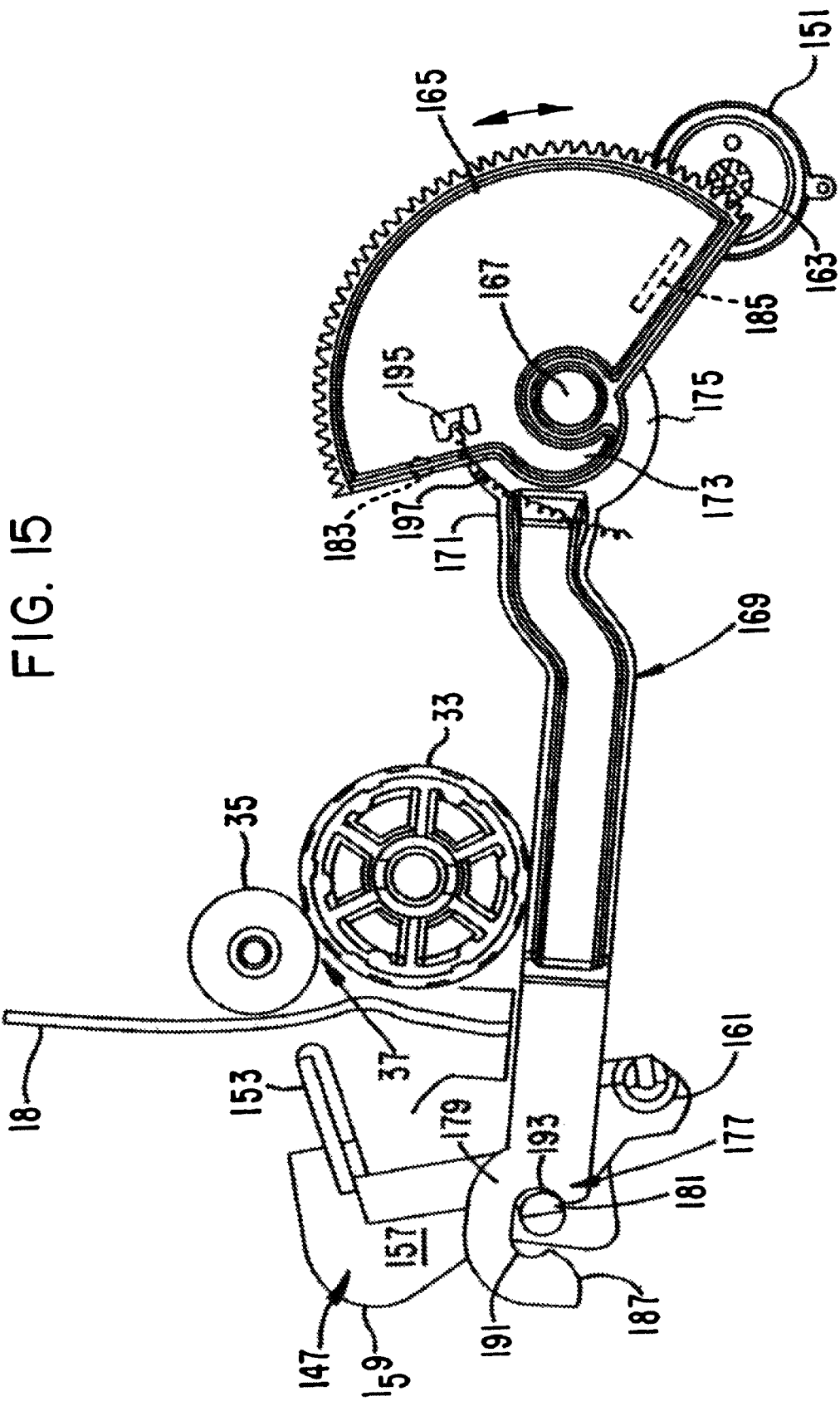
FIG. 15 is a side elevational view of the web feed transfer mechanism and feed mechanism of FIG. 14.

Referring to FIGS. 14-15, the transfer drive system includes an output gear 163 which is connected to the output shaft of transfer motor 151, and a transfer gear 165 that meshes with output gear 163 so that transfer gear 165 will rotate when transfer motor 151 is operated. Transfer gear 165 forms an arc sector of a circle. A plurality of gear teeth are formed along the outer circumference of transfer gear 165. These teeth mesh with the teeth of output gear 163. Output gear 163 drives transfer gear 165 in a clockwise direction (as shown in FIG. 15) when transfer motor 151 is operated. Transfer gear 165 rotates about an axis 167 that is located at the center of the circle from which the arc sector of transfer gear 165 is taken.

A rigid transfer link 169 extends between transfer gear 165 and transfer bar 147 for imparting movement to transfer bar 147 in relation to the rotation of transfer gear 165. Transfer link 169 is, at a first end 171, rotatably mounted on an enlarged inwardly directed hub portion 173 of transfer gear 165, by a linkage plate 175. Hub portion 173 is eccentrically located relative to transfer gear rotation axis 167, as best seen in FIG. 15. As transfer gear 165 is driven in a clockwise direction by output gear 163, as shown in FIG. 15, linkage plate 175 is displaced slightly upwardly and then rearwardly, following the corresponding translation of eccentric hub 173.

Due to the freely rotatable mount of linkage plate 175 on hub 173, the clockwise rotation of hub 175 is not transmitted to transfer link 169. The first end 171 of transfer link 169 rises and moves rearwardly with the translatory movement of linkage plate 175.

At a second end 177, transfer link 169 includes an open bottom hook 179 that engages a post 181 extending outwardly from one side of transfer bar 147 in the direction of one of left side chassis member 7, in spaced relation to the pivot axis of transfer bar 147. As first end 171 of transfer link 169 moves with linkage plate 175 in response to rotation of transfer gear 165, hook 179 remains engaged with post 181 and causes it to be pulled rearwardly, as transfer link 169 both rotates and translates. As a result, transfer bar 147 is rotated about its pivot axis and fingers 153 begin to move toward nip 37. With continued rotation of transfer gear 165, transfer bar 147 is positioned immediately in front of nip 37 so that transfer fingers 153 contact web 18 and position it within nip 37. A resistance to further rotation of transfer gear 165, resulting from a pressing contact of fingers 153 against one or both of feed roller 33 and pressure roller 35, or resulting from a stop member 183 suitably placed on a backside of transfer gear 165 abutting with a suitably placed stop structure 185 of left side chassis member 7, can be used to trigger a deactivation of transfer motor 151 by known means. For example, a high current associated with a stall condition of motor 151 can be sensed by appropriate circuitry provided on main PCB 133 (see FIGS. 2 and 9) and used to deactivate motor 151.

As seen in FIGS. 14-15, the bottom of hook 179 is open and the front, inner edge 187 of hook 179 is beveled so that post 181 can move in and out of hook 179 depending on the positions of front cover 13. Edge 187 forms at its top a peak 189 for engaging post 181 and urging it into a seat 191 formed thereabove when transfer link 169 moves toward the rear of dispenser 1 in response to rotation of transfer gear 165. When cover 13 is opened, post 181 falls out of hook 179 through the open bottom and transfer bar 147 rotates downwardly, as discussed below. As cover 13 is closed, post 181 moves into the open, lower side of hook 179 by passing along beveled edge 187. The inner, open area of hook 179 is larger than the diameter of post 181 so that post 181 has adequate clearance to drop out of hook 179 and away from transfer link 169 when cover 13 is opened, and to return into hook 179 as cover 13 is closed. The rearward inside of hook 179 includes a recessed portion forming a seat 193 for receiving post 181 and returning it with transfer bar 147 to its set position.

The transfer mechanism also preferably includes a return mechanism for returning transfer bar 147 to its set position. In a preferred embodiment, this mechanism comprises a spring retaining member 195 which secures a first end of a coil spring 197, or other type of resilient return member, to transfer gear 165. The second end of coil spring 197 is suitably secured to left chassis member 7 or another part of dispenser 1. When transfer bar 147 is in its set position, coil spring 197 is relaxed or just lightly tensioned. When transfer gear 165 rotates in response to operation of transfer motor 151 and rotation of gear 163, coil spring 197 is extended, transfer link 169 is caused to move toward the rear of the dispenser and transfer bar 147 rotates in the direction of nip 37. After transfer gear 165 has rotated to its limit (thus causing a leading edge portion of web 18 to be transferred into nip 37), transfer motor 151 is deactivated. The output shaft of deactivated transfer motor 151 free-wheels in its reverse direction, allowing spring 197 to return to its rest state while returning transfer gear 165 to its set position (the same position it was in before transfer motor 151 was activated). During the return stroke, seat 193 engages post 181 and returns it and transfer bar 147 to their set positions. Instead of a spring-biased return mechanism, the motor control circuitry could provide a reverse drive of transfer motor 151 serving to drive transfer bar 147, transfer link 169 and transfer gear 165 to their set positions after web 18 has been introduced and fed through nip 37.

To load a roll in dispenser 1, or to transfer a partially depleted roll from upper supports 21, 27 to lower supports 29, 31, an attendant unlocks or unlatches dispenser cover 13 and rotates it downwardly to the web loading position shown in FIG. 1. In its open position, the front panel of cover 13 will no longer abut against transfer bar 147 and support it in its set position. As a result, transfer bar 147 will fall out of hook 179. Transfer bar 147 pivots downwardly away from nip 37 about stub shafts 161 as has been described. Both cover 13 and transfer bar 147 assume respective web loading positions where they will not interfere with an attendant installing a roll in the dispenser 1 and positioning a leading edge portion of web 18 for transfer into feed nip 37.

In a preferred embodiment, upon loading a reserve roll into upper pair of supports 21, 27, the attendant will position the leading edge portion of web 18 in cradle 107 located in front of, and below, feed nip 37. After positioning web 18 in cradle 107, the attendant will close cover 13 by rotating it upward toward the chassis assembly and back panel member 11. As the cover is rotated upwardly, an inner front surface of cover 13 contacts cover engaging members 159 on transfer bar 147 and rotates transfer bar 147 to its set position, as has been described. As cover 13 is being closed and transfer bar 14 is rotated to its set position, post 181 is pivoted upwardly into hook 179.

As cover 13 is closed, cover switch 109 (see FIGS. 1 and 20) is engaged to activate feed roller drive motor 49, to advance any sheet material present in the feed mechanism. Concurrently, sensors 111, 113 detect the presence or absence of web 18 in discharge chute 12. When an absence of web continues to be detected by sensors 111, 113 for a predetermined advancement interval, the feed transfer mechanism is actuated, as feed roller 33 continues to be driven. With reference again to FIG. 15, transfer motor 151 drives output gear 163 in a counter-clockwise direction, which in turn drives transfer gear 165 in a clockwise direction. This results in transfer link 169 moving rearwardly. As transfer link 169 moves rearwardly, hook 179 engages post 181 and imparts the movement of link 169 thereto. As post 181 is pulled rearwardly, transfer bar 147 pivots toward feed nip 37 about stub shafts 161. Fingers 153 engage the leading portion of web 18 hanging in front of nip 37. Fingers 153 rotate until they abut against, or reside in close proximity to, feed roller 33 and/or pressure roller 35. As this occurs, web 18 is introduced into nip 37 and taken up by the feed mechanism, and transfer motor 151 is deactivated. Once motor 151 stops, return spring 197 (or another return mechanism) causes transfer link 169 and transfer bar 147 to return to their set positions.

After a transfer of feed to a reserve roll rotatably supported between upper supports 21, 27, dispensing from that roll (now the working roll) may continue until the web sensing system detects that that roll has been fully depleted. (As previously described, a sensor may, in the interim, signal a partial depletion condition permitting transfer of the roll from upper supports 21, 27 to lower supports 29, 31.) When depletion of the working roll is sensed, e.g., by the continued absence of web material at the sensing position following advancement of the feed roller a predetermined amount, the transfer mechanism is activated for introduction of a leading portion of the reserve roll material into the feed nip. This introduction is accomplished in the manner discussed previously with respect to the introduction and feeding of an initial roll loaded into the dispenser following closure of cover 13. In carrying out an automatic feed transfer, fingers 153 position the reserve web in nip 37 without cover 13 being opened, so that the reserve web is introduced into, and picked up by, the feed mechanism immediately following depletion of the prior roll. The feed transfer operation may thus be carried out in a manner that is substantially transparent to the user.

Electrically Actuated Release of Spring Biased Transfer Bar

An alternative arrangement for effecting a transfer of feed to a new or reserve roll is now described with reference to FIGS. 16A-16E. In this embodiment, an electrically actuated device, e.g., a motor 199, is utilized to actuate release of a transfer bar 200, which is biased toward feed nip 371 by a spring 201, or the like.

Figure 16A:
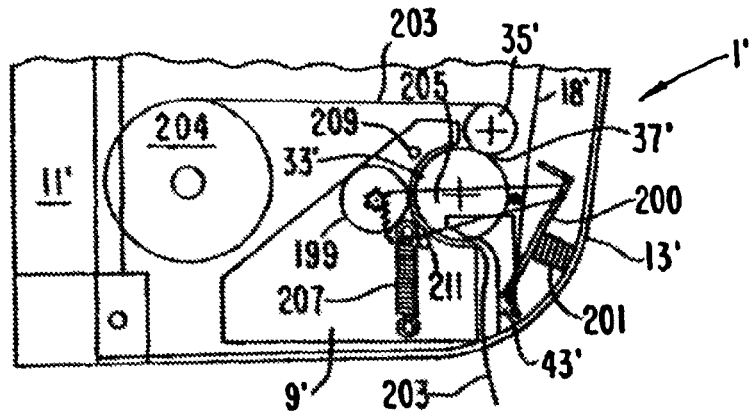

Referring to FIG. 16A, a dispenser 1' is shown in a condition where web material 203 has been fed from a stub roll 204 through a feed mechanism formed by a feed roller 33', a pinch roller 35', a middle chassis member 9' and a face plate structure 43'. A reserve roll mounted in an upper pair of supports (not shown) has a leading portion of sheet material 18' hanging down in front of a feed nip 37'. Pivotally mounted transfer bar 200 is spring loaded rearwardly by spring 201, which is braced against an inside front surface of closed cover 13'. Transfer bar 200 is held in a set position by a pivotally mounted transfer link 205. Transfer link 205 is biased to its most counter-clockwise position by a tension spring 207. The pivotal motion of transfer link 205 is limited in both directions by pins 209, 211. When the web 203 from stub roll 204 is completely depleted, the dispenser control system senses this (in a manner as has been described), and power is applied to transfer motor 199.

Figure 16B:
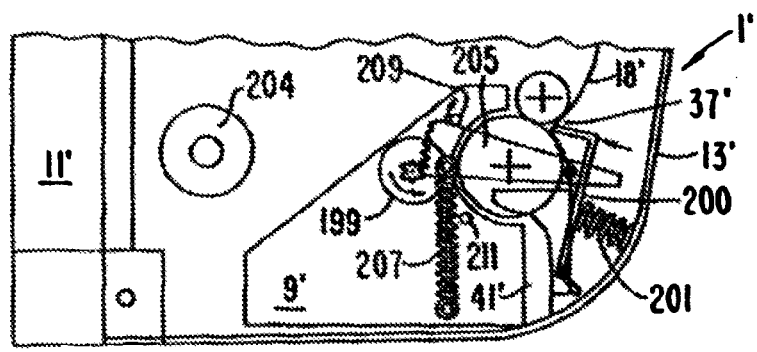

Referring to FIG. 16B, dispenser 1' is shown after stub roll 204 has been completely depleted and transfer motor 199 has been activated to rotate transfer link 205 clockwise, overcoming the pull of spring 207. This rotation of transfer link 205 frees transfer bar 200 to rotate counter-clockwise under the bias of spring 201, pushing the leading portion of web 18' into feed nip 37'.

Figure 16C:
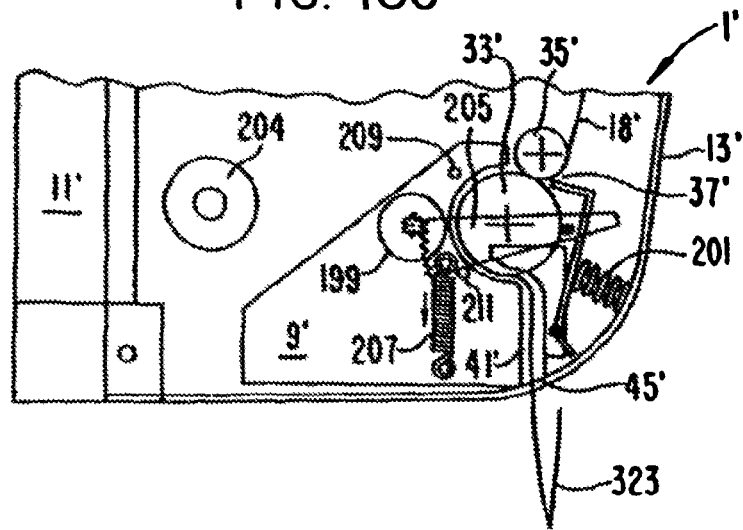
Figure 17:
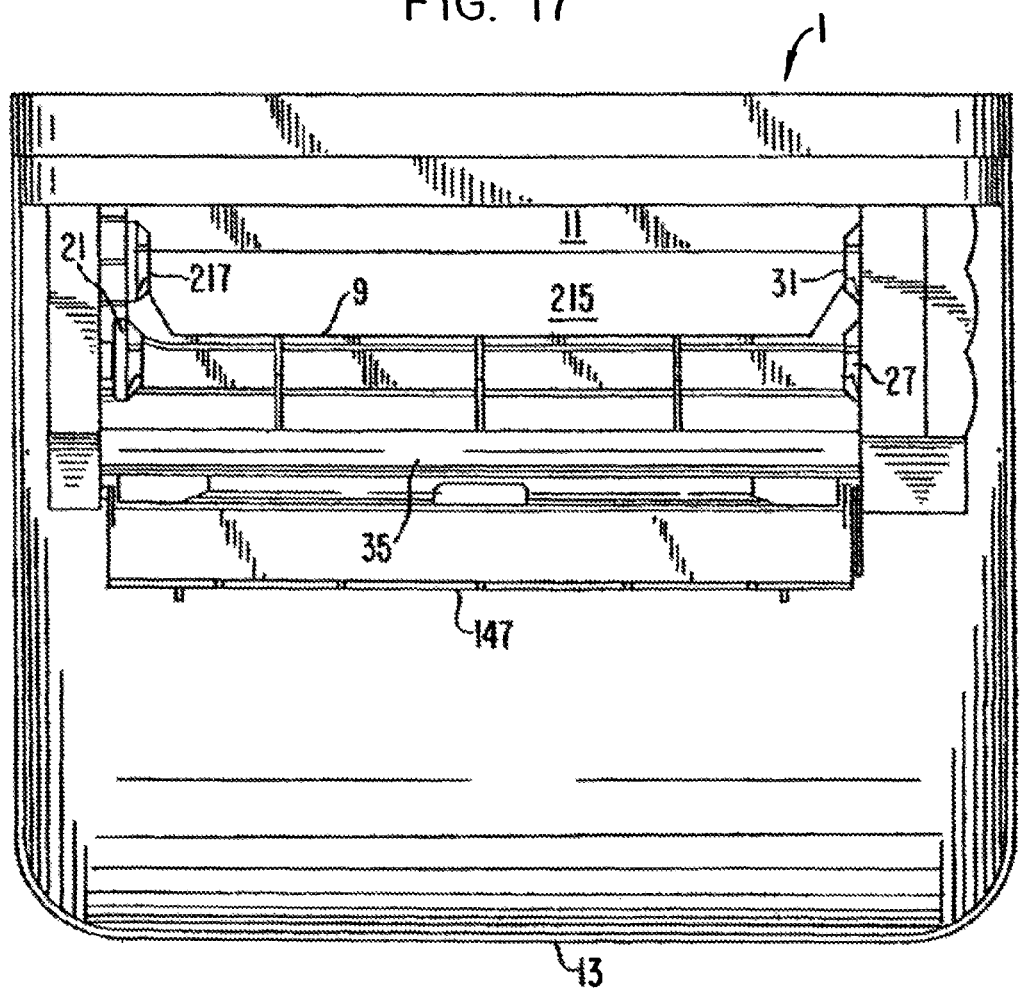
FIG. 17 is a top plan view of the dispenser shown in FIG. 1, with the cover thereof pivoted to the open position.

In FIG. 16C, dispenser 1' is shown just after a feed transfer has been completed. The leading sheet segment has been fed through nip 37' and has emerged from discharge chute 41' and outlet 45' in a folded-over state. Transfer motor 199 is turned off once transfer link 205 has been pivoted to its limit. This can be effected by having the dispenser electronics detect a stall condition as transfer link 205 bottoms on travel limiting pin 209. Once motor 199 is switched off, transfer link 207 is permitted to relax into its counter-clockwise position against pin 211, under the bias of spring 204. In place of motor 199, an electric solenoid or the like may be suitably arranged to move transfer link 205 to its transfer bar setting and/or release positions.

Referring now to FIG. 16D, dispenser 1' is shown with dispenser cover 13' open so that it may be refilled. Having cover 13' open allows transfer bar 200 to fall open (pivot forwardly) by virtue of its over-center position. Empty stub roll core 204 has been released to fall through a gap 213 formed between middle chassis member 9' and back panel member 11' into cover 13' where it can be easily removed by the attendant. The roll of paper held in the upper supports (not shown), from which web 18' extends, has been depleted to the point that it may be transferred from the upper pair of supports to the lower position, as illustrated in FIG. 16E, while web 18' remains fed through the feed mechanism.

FIG. 16E shows dispenser 1' in a reload condition. Working roll 17' has been moved to the lower stub roll position while web 18' remains fed through the feed mechanism. A new full roll (not shown) has been placed in the upper supports and a leading segment 18" drapes down over feed nip 37'. The web can be placed in a clip or cradle, as has been described, or transfer bar 200 itself may serve to hold the web. Upon closing cover 13', transfer bar spring 201 is loaded and dispenser 1' assumes once again the condition shown in FIG. 16A.

Roll Core Removal

Referring now to FIGS. 1, 4, 9, 17 and 18, a system permitting highly efficient removal of spent stub rolls (roll cores) from dispenser 1 is described. Lower roll support 29 connected to right side chassis member 5, together with opposing support hub 31 connected to left side chassis member 7, provide a releasable rotatable mount for a web material roll transferred down from upper supports 21, 27. So mounted, a transferred "stub" roll, from which material may continue to be fed, is positioned in alignment with an elongated, generally rectangular gap 215 (see FIG. 17) defined between dispenser back panel member 11 and middle chassis member 9. Support 29 is made movable by finger operation between a core retention position and a core release position. Displacement of support 29 to its release position moves a mounting hub 217 thereof away from opposing (fixed) support hub 31, thereby increasing the distance between the opposed roll core hubs to the point where the core 219 (see FIG. 18) is no longer supported. Upon support 29 being moved to its release position, retained core 219 is thus released to fall directly through gap 215. In its open position, e.g., as seen in FIG. 9, dispenser cover 13 is positioned to receive roll core 219 dropped through gap 215, and to place it where a custodian can easily remove it.

Figure 18:
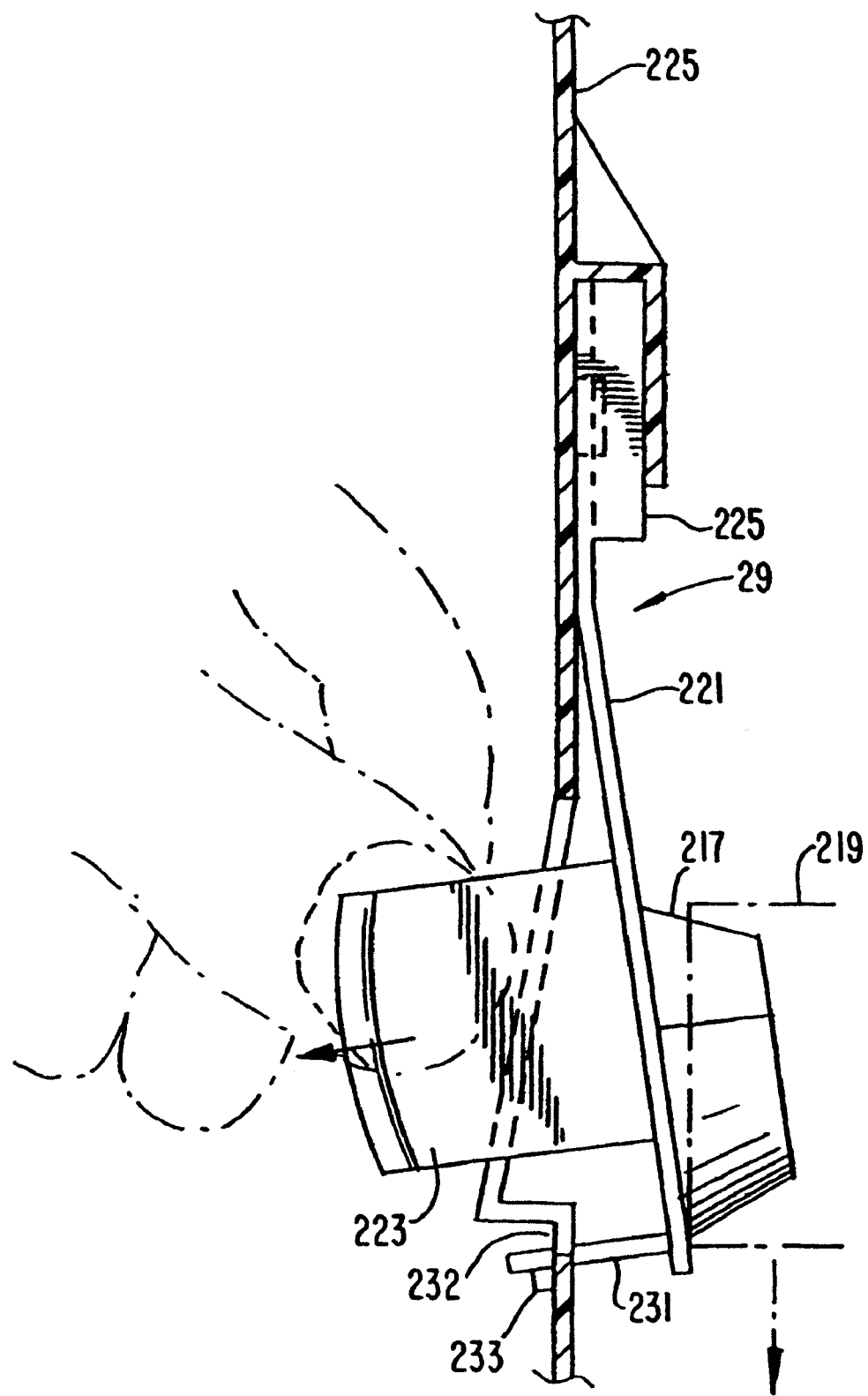
FIG. 18 is a cross-sectional view illustrating a finger releasable roll core support mechanism in accordance with one of the present inventions.

As seen clearly in FIG. 18, releasable support 29 includes a spring arm 221, a finger graspable release handle 223, and roll core mounting hub 217. At its upper end 225, spring arm 221 is cantilever mounted to an inner side of a wall 225 of right side chassis member 5. In its rest position, a major lower portion of spring arm 221 is angled inwardly with respect to the inner side 225, toward roll core 219. Release handle 223 and mounting hub 217 are each disposed adjacent the lower end of spring arm 221, protruding laterally from opposite sides thereof.

Release handle 223 is provided in the form of a slightly curved tab with a built-up outer edge 227. Handle 223 extends through a passage 229 formed in wall 225 such that it is readily graspable by an attendant from the outside of right side chassis member 5, once cover 13 is opened.

A catch arm 231 is also preferably attached to the lower end of spring arm 221. Catch arm 231 extends laterally from spring arm 221, below release handle 223, through a passage 232 provided chassis wall 225. Catch arm 231 has a downwardly directed catch member 233 proximate its outer end 235. Catch member 233 and passage 229 are sized and configured such that catch member 233 abuts with an outside surface of chassis wall 225 to limit the inward deflection of spring arm 221 when no roll core 219 is present. As such, catch member 233 serves to maintain spring arm 221 in a set position, facilitating roll insertion by mere dropping of the roll in between support hubs 217, 31; the need for separate manual retraction of roll support 29 using release handle 223 is not required to load a roll.

Cover 13 is pivotally mounted at its lower rear corner to back panel member 11, and opens by rotating away from the chassis assembly to the open position shown, e.g., in FIG. 9. In the open position, a cavity 235 formed by the cover front panel and sidewalls extends below gap 215 to catch a core 219 released from lower supports 29, 31 and dropped through gap 215. As best seen in FIG. 9, in the open position, the cover front panel forms a cavity floor 237 which is inclined slightly forwardly. This incline serves to encourage a core dropped thereon to roll, under gravitational force, into a forward portion of the open cover, where it may be readily removed by an attendant.

Proximity Sensing System

Figure 20:
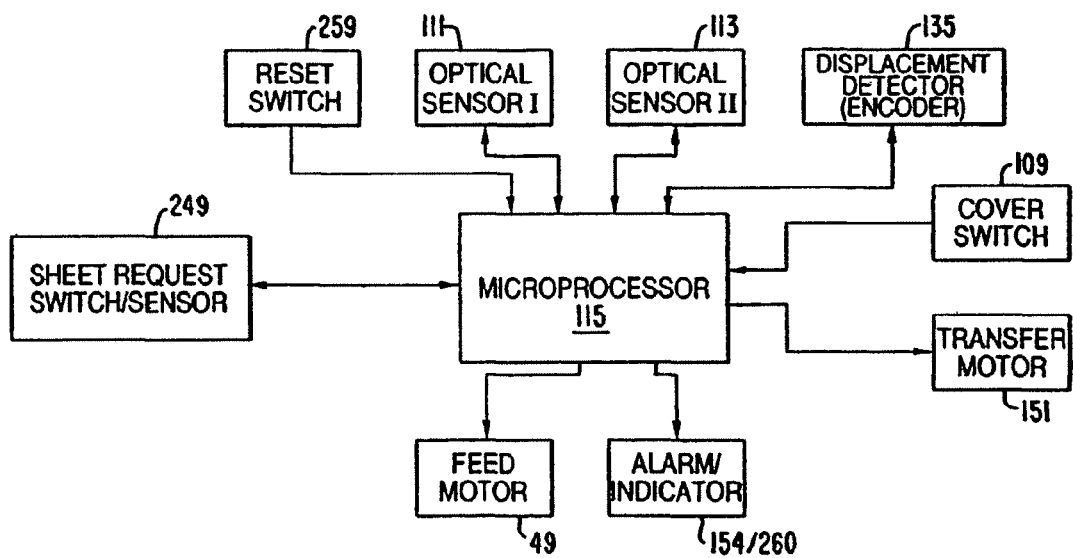
FIG. 20 is a block diagram of an electrical control system that may be implemented in the dispenser of FIG. 1.

Referring to FIG. 20, dispenser 1 preferably includes, as a sheet request switch/sensor 249, a proximity sensing system for detecting the presence of a user's hands or the like as they approach the front of dispenser 1. As generally described in application Ser. No. 09/081,637, the sensor may be of any suitable type, and preferably is a non-contact sensor such as a capacitive or IR sensor. In the illustrated preferred embodiment, a proximity sensor antenna plate 239 (see, e.g., FIGS. 11-12) is driven by an oscillator circuit. The oscillator circuit is coupled with microprocessor 115, which detects the presence of a user's hand based upon a voltage related to the amplitude of the oscillations. Microprocessor 115 activates motor 49 when a hand is detected, so as to drive feed roller 33 and thereby dispense a length of the material.

As best seen in FIGS. 11-12, antenna plate 239 may be formed as a metalized front-facing surface of an elongated printed circuit board (PCB) 241 that may be clipped into place on faceplate structure 43, in overlying relation with PCB 123. This may be accomplished with a deflectable spring arm 243 located on faceplate structure 43, to the right side of recess 125, and a pair of shoulder-forming bosses 245, 247 positioned one above the other at a left side of recess 125.

Figure 19:
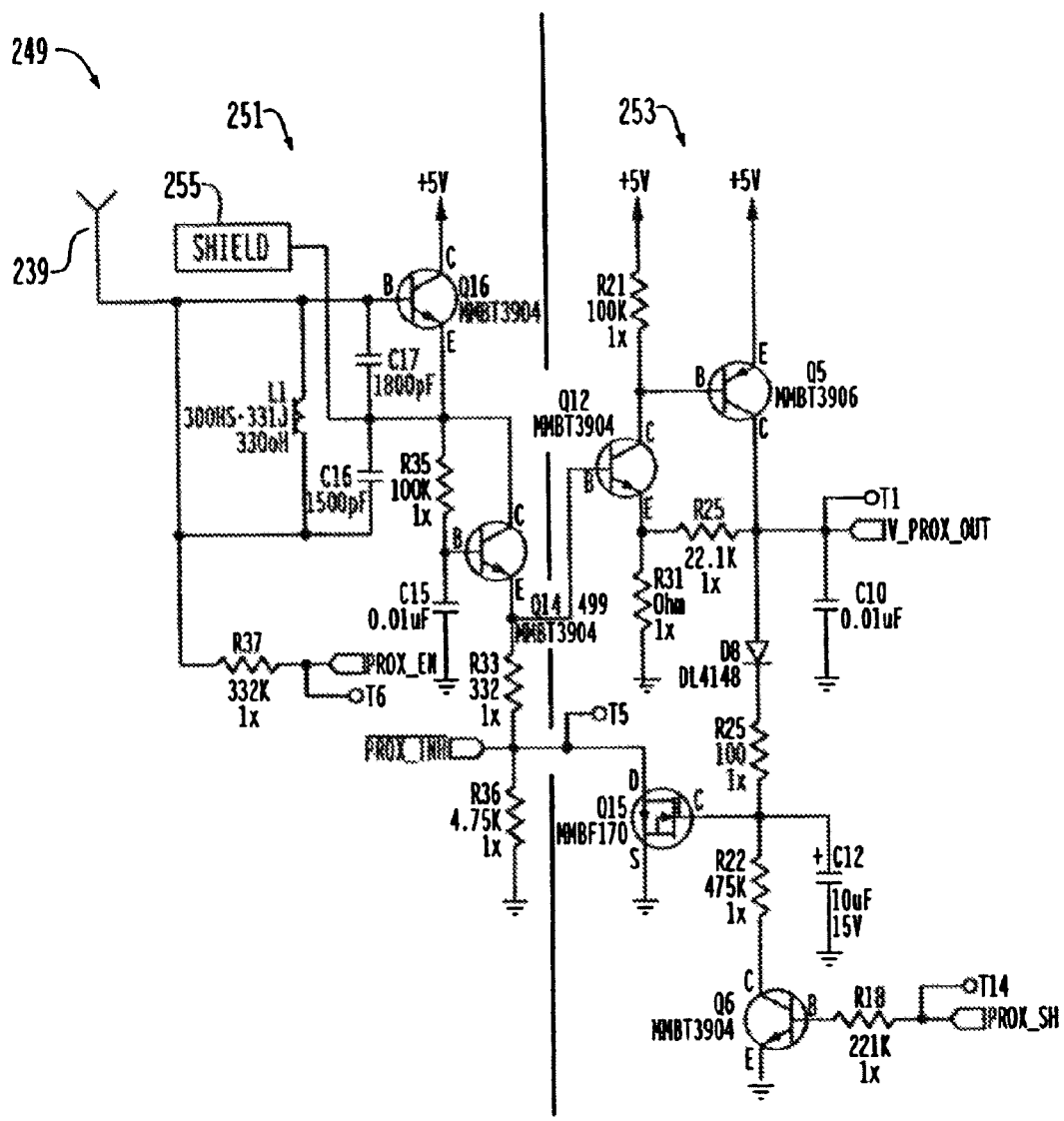
FIG. 19 shows a schematic diagram of a proximity sensor system used for sensing the proximity of a user's hand, according to one of the present inventions.

FIG. 19 shows a schematic diagram of a preferred embodiment of a proximity sensing system 249 that is used for sensing the proximity of user's hand as the user's hand approaches the front of the dispenser 10. Proximity sensing system 249 includes an oscillator circuit 251 and an automatic sensitivity control circuit 253. Oscillator circuit 251 includes an inductor L1, capacitors C15, C16 and C17, npn transistors Q16 and Q14, and resistors R35 and R17 that are connected in a Colpitts oscillator-type topology, that is, having a split capacitor configuration (capacitors C16 and C17). Automatic sensitivity control circuit 253 includes transistors Q12, Q5 and Q15.

In oscillator circuit 251, the base of transistor Q16 is connected to one terminal of inductor L1 and to one terminal of capacitor C17. The other terminal of capacitor C17 is connected to one terminal of capacitor C16. The other terminal of capacitor C16 is connected to the remaining terminal of inductor L1. Antenna plate 239 is connected to the base of transistor Q16 at the point in the resonant circuit formed by inductor L1 and capacitors C16 and C17 that is normally connected to ground. A shield 255 is physically positioned between antenna plate 239 and optical sensors 115, 117, and is connected to the junction of capacitors C16 and C17. The collector of transistor Q14 is connected to the emitter of transistor Q16 and to the junction of capacitors C16 and C17. The base of transistor Q14 is connected to the emitter of transistor Q16 through resistor R35, and to ground through capacitor C15. The emitter of transistor Q14 is connected to an automatic sensitivity control circuit formed by transistors Q12, Q5 and Q15, and which will be described below.

As shown in FIG. 19, transistors Q16 and Q14 are each preferably MMBT3904 npn transistors. Preferably, inductor L1 is a 330 µH inductor, capacitor C16 is a 1500 pF capacitor, capacitor C17 is an 1800 pF capacitor, and capacitor C15 is an 0.01 µF capacitor. Preferably, resistor R35 is a 100 kΩ resistor. The collector of transistor Q16 is connected to a suitable power supply voltage, such as +5 Vdc, and the base of transistor Q16 is connected to a drive voltage signal PROX_EN that is output from microprocessor 115 through resistor R37.

Resistor R37 is preferably 332 kΩ. Test point T6 is connected to signal PROX_EN for convenience in troubleshooting. When drive voltage signal PROX_EN is low, oscillator circuit 251 is disabled. When drive voltage signal PROX_EN is high, oscillator circuit 251 is enabled.

Transistor Q16 is the active element of oscillator circuit 2000, and transistor Q14 is an active load for transistor Q16. Transistor Q14 allows the necessary current to flow through transistor Q16, while not loading down the output of transistor Q16. Transistor Q14 also stabilizes the amplitude of the oscillator output by adjusting the current through transistor Q16. In the absence of oscillation, transistor Q14 is biased fully on by resistor R35, allowing maximum current to flow through transistor Q16. Transistor Q16 receives base drive through resistor R37. The transistor noise that starts oscillation is coupled to ground through antenna plate 239. There is always sufficient stray capacitance through the sensor field to antenna plate 239 for oscillation to occur, even when no hand is in the sensing field of antenna plate 239.

In the illustrated preferred arrangement of antenna plate 239 and optical sensors 115, 117, the optical sensors contribute a stray capacitance that is approximately two orders of magnitude greater that the stray capacitance of a hand. That is, the stray capacitance between antennal plate 239 and optical sensors is about 100 pF and the stray capacitance of a hand is about 1 pF. In the illustrated preferred arrangement of the invention, oscillator circuit 249 drives shield 255 (see FIGS. 12 and 19), which is formed as a metalized layer on a backside of PCB 241 (which has antenna plate 239 formed on its front surface). This reduces the baseline stray capacitance of antenna plate 239, and minimizes the stray capacitance to antenna plate 239 caused by optical sensors 115, 117, thereby improving sensitivity for detecting the presence of a hand near antenna plate 239.

Figure 22:
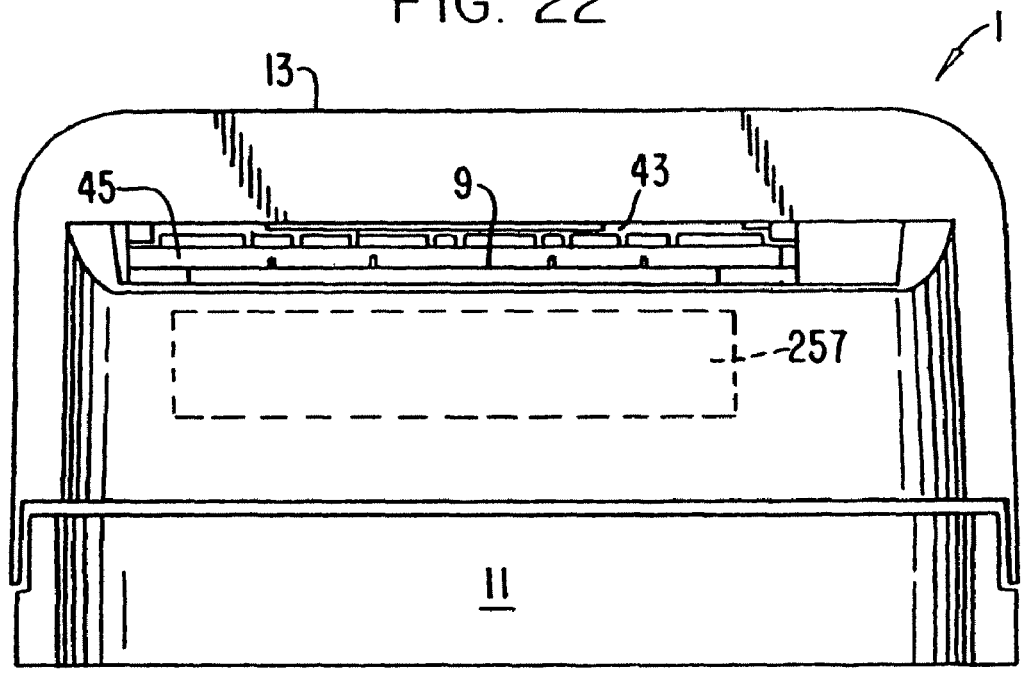
FIG. 22 is a bottom plan view of the dispenser of FIG. 1, with the cover thereof pivoted to a closed position.

As depicted in FIG. 22, a relatively large ground plate 257 is preferably mounted on the bottom surface of middle chassis member 9. Ground plate 257 may be provided, e.g., in the form of an adhesively applied metal foil/plastic laminate. Ground plate 257 serves to direct downwardly and render more predictable the sensing field generated by the oscillation applied to antenna plate 239, as the signal naturally seeks the most direct path to ground.

Once oscillation begins, the base-to-collector junction of transistor Q14 becomes forward biased, draining some charge off capacitor C15, and causing transistor Q14 to reduce the current drawn through transistor Q16 in order to maintain a fixed oscillation amplitude. The positive peak of oscillation at the emitter of transistor Q16 is approximately Vcc (+5 Vdc), while the negative peak is approximately the voltage on capacitor C15 minus about 0.6 V. The voltage on capacitor C15 is held constant because the emitter voltage of transistor Q14 is held constant by the automatic sensitivity control circuit formed by transistors Q12, Q5 and Q15.

When a hand is placed near antenna plate 239, the stray capacitance of antenna plate 239 increases from a baseline stray capacitance of antenna plate 239 caused the dispenser components and the ambient environment in which dispenser is positioned. As the stray capacitance increases, the path that the sensing field must travel in order to return to ground is shortened, and the oscillator tries to oscillate at an increased amplitude. The increased oscillation amplitude drains off additional charge from capacitor C15, reducing the current through transistor Q16, and thereby counteracting the increased amplitude of oscillation. The change in current is sensed across resistors R33 and R36 and is amplified by Q12 and Q5 to a usable level and sent to an analog input of microprocessor 115 as a V_PROX_OUT signal, where it is used to trigger a dispensing operation. The sudden drop in voltage at the collector of Q5 is interference filtered and detected by firmware and, if considered a valid trigger event, starts the dispenser. Test point T1 is connected to signal V_PROX_OUT for convenience in troubleshooting.

Automatic sensitivity control circuit 253 includes transistors Q12, Q5, Q15 and Q6, resistors R18, R21, R22, R25, R26, R31, R33 and R36, diode D8 and capacitors C10 and C12. The base of transistor Q12 is connected to the emitter of transistor Q14. The collector of transistor Q12 is connected to the power supply voltage through resistor R21 and to the base of transistor Q5. The emitter of transistor Q5 is connected to the power supply voltage, and the collector of transistor Q5 is connected to the emitter of transistor Q12 through resistor R25, to the anode of diode D8, and to one terminal of capacitor C10. The cathode of diode D8 is connected to the gate of transistor Q15 and to one terminal of capacitor C12. The drain of transistor Q15 is connected to the emitter of transistor Q14 through resistor R33 and to ground through resistor R36. The collector of transistor Q6 is connected to the gate of transistor Q16 through resistor R 22. The emitter of transistor Q6 is connected to ground, and the base of transistor Q6 is connected to a PROX_SH signal that is output from microprocessor 115.

As shown in FIG. 19, transistors Q12 and Q6 are each preferably MMBT3905 npn transistors, transistor Q5 is preferably an MMBT3906 pnp transistor, transistor Q15 is preferably an MMBF170 MOSFET. Preferably, the resistance values of resistor R18 is 221 kΩ, R21 is 100 kΩ, resistor R22 is 475 kΩ, resistor R25 is 22.1 kΩ, resistor R26 is 100Ω, resistor R31 is 499Ω, resistor R33 is 332Ω and resistor R36 is 4.75 kΩ. Preferably, diode D8 is a DL4148 diode, and preferably capacitor C10 is an 0.01° F. capacitor. Capacitor C12 is preferably a 10 µF capacitor.

The automatic sensitivity control circuitry formed by transistors Q12, Q5 and Q15 compensates for the reduction in sensitivity for sensing a hand when more stray capacitance is added to the dispenser's sense environment, that is, when the baseline stray capacitance of antenna plate 239 is relatively large because, e.g., a large metal object is located near antenna plate 239. The reduction in sensitivity for sensing a hand in an environment providing a relatively larger baseline stray capacitance is due to the fact that the change in capacitance due to a hand in the sensing field is a relatively smaller percentage of the overall capacitance sensed by antenna plate 239.

In operation, the automatic sensitivity control circuitry maintains approximately 3 V at the collector of transistor Q5 and approximately 0.6 V at the emitter of transistor Q14. When, e.g., a large metal object is brought near dispenser 10, transistor Q14 will reduce the current flow through transistor Q16, thereby correcting an increase in the oscillation amplitude caused by the increased stray capacitance sensed by antenna plate 239. The reduction in current through transistor Q16 lowers the voltage on the emitter of transistor Q14. The voltage at the collector of transistor Q5 begins to decrease due to the gain of transistors Q12 and Q5 (as set by resistors R31 and R25). As a result, capacitor C12 discharges through its own leakage or through resistor R22 (depending on firmware mode) and causes transistor Q15 to conduct less. Because transistor Q15 is a MOSFET, the resistance of transistor Q15 increases, thereby increasing the resistance between the emitter of transistor Q14 and ground and effectively increasing the proximity detection circuit gain, while lowering the oscillator current by an corresponding amount. Resistors R33 and R36 limit the adjustment range of the control loop in order to keep the automatic sensitivity control loop stable. Transistor Q6 and resistor R22 function as an AGC pull-down circuit for speeding recalibration of proximity sensor circuit 251 under control of microprocessor 115 through the PROX_SH signal. Test point T14 is connected to signal PROX_SH for convenience in troubleshooting.

When a hand is removed from the sensing field, readjustment of the control loop for maximum sensitivity occurs rapidly due to diode D8. Reduction of proximity sensitivity, such as when a hand is in the sensing field, is much slower and is determined by the leakage in capacitor C12 and whether transistor Q6 is turned on.

While proximity sensor system 249 has been described in the context of sheet material dispenser 1, it should be understood that the proximity sensor system of the present invention can be used in virtually any application where it is desired to detect the presence or proximity of a user, or other object, relative to something else. This includes (but is not limited to) various types of hands-free or automatic dispenser devices, such as water faucets or fountains, soap dispensers and drink dispensers.

Additional Electrical System/Control Aspects

The various electrical components of dispenser 1, and their interrelationship with each other, are shown in the block diagram of FIG. 20. In addition to receiving input signals from proximity sensing system 249, optical sensors 111, 113, sheet displacement detector (encoder) 135, and cover switch 109, microprocessor 115 may also optionally receive input from a manual reset button 259 effectively serving to return the state of microprocessor 115 to the initial state assumed upon closure of cover 13. In addition, microprocessor 115 may be used to pulse power on and off to optical sensors 111, 113, and to displacement detector 135, as an energy saving measure. As a further energy saving measure, program logic (e.g., a watch-dog timer) may be provided to place microprocessor 115 in a sleep mode after a predetermined period of inactivity, and to periodically wake the system from the sleep mode. In a preferred embodiment, proximity sensing system 249 is powered down, and not polled, so long as optical sensors 111, 113 indicate the presence of web material in discharge chute 19.

Microprocessor 115 and/or associated circuitry preferably comprise a voltage detector for detecting a low battery condition of the dispenser and indicating the same, e.g., by flashing a low battery indicator LED 260 (see FIGS. 1 and 20). Microprocessor 115 may also be used in conjunction with the voltage detector to provide pulse width modulation (PWM) control of drive motor 49 and/or transfer motor 151, in order to maintain a substantially constant motor speed despite fluctuations in the output voltage of the batteries over their lifetime. In this manner, a desirable consistency of dispense (and transfer) cycle times can be achieved; in addition, potential for the previously described feed mechanism overshoot problem can be reduced.

An option switch may be provided for switching dispenser 1 to a "towel hanging" mode. Upon closure of cover 13, microprocessor 115 may check the option switch and if set to the "towel hanging" mode, the proximity sensing system may be disabled entirely until the next system reset (such as by a subsequent cover closure, or actuation of reset switch 259). In this mode, optical sensors 111, 113 may be polled at a reduced rate (e.g., two times per second) to cause a dispensing operation to be carried out upon the detection of a web absent condition. Alternatively, optical sensors 111, 113 may be powered down and not polled until after microprocessor 115 is awakened by an interrupt generated by the proximity sensing system detecting a hand in close proximity to the dispenser (a sheet request). Instead of waking microprocessor 115 by interrupt, a watch dog timer may be employed to periodically wake microprocessor 115 to poll the proximity sensing system, e.g., at a rate of five times per second.

Electrostatic Discharge Protection

Operation of the electronic control circuitry of dispenser 1 may be adversely affected by the build-up of static electricity on feed roller 33 and/or pressure roller 35. This is particularly so due to the proximity of the circuitry to the feed and pressure rollers. Advancement of paper or other insulative web materials across the rollers ordinarily would result in the build-up of a considerable amount of static electricity on the rollers, thus placing the electronic control circuitry at risk of malfunction or damage.

An approach utilized in dispenser 1 for avoiding electrostatic discharge build-up on feed roller 33 and pressure roller 35 is now described with reference to FIG. 4. In accordance with the teachings of co-pending, commonly owned U.S. patent application Ser. No. 09/966,124, filed Sep. 27, 2001, a conductive path may be formed by a wire, cable, metal strap and/or other conductor that extends from pressure roller 35 to a dispenser supporting structure (e.g., a mounting wall). The supporting structure may act as a local ground for discharging static electricity generated as web material (typically, but not necessarily, paper) is passed through feed nip 37.

As illustrated in FIG. 4, pressure roller 35 may include a pair of opposing support pins 261 (one shown) protruding outwardly from its opposite ends, which serve to rotatably mount pressure roller 35 between side chassis members 5, 7. Pins 261 are preferably formed of metal, e.g., aluminum, or other highly conductive material, as is roller 35 itself. A wire, cable, metal strap, etc. may be used to establish a conductive path which extends from roller pin 261 to a terminal, such as a screw or spring contact, that can be connected to a wall or other supporting structure upon which dispenser 1 is mounted. Metal pin 261 and metal pressure roller 35 complete the conductive path from the supporting structure (e.g., wall) serving as a local ground, to feed nip 37, whereby static electricity built-up on the rubber or like insulative gripping surface of feed roller 33 may be continuously discharged.

In order to provide a reliable, uninterrupted contact between a wire 263 extending to the rear side of back panel member 11 and rotatable pressure roller pin 261, a metal strap 265 forms a contact arm that is spring biased into sliding contact with an outer circumferential surface of pin 26. The contact arm thus remains in contact with pin 26 as it rotates. Strap 265 is secured within right side chassis member 5 by a pair of guides 267. Contact arm is elastically bent around guides 267 to form a leaf spring serving to bias the end of the thus formed arm into reliable sliding electrical contact with roller pin 261. An opposite end of metal strap 265 connects with wire 263. Wire 263 is threaded along an outer perimeter of right side chassis member 5 to a back side of back panel member 11 where it may be connected to the dispenser support structure (e.g., a wall), such as by a screw or spring contact.

Use of elongated conductors, such as wire 263 and metal strap 265, is just one of many possible approaches for providing a conductive path from roller 265 to the dispenser support structure. In lieu of a separate wire or like discrete elongated conductor, the desired conductive path could be established by interconnected metal or other conductive structural components incorporated into or directly forming chassis assembly 3 and/or back panel member 11. In the event the dispenser support structure is highly insulative (e.g., a ceramic tile wall), it has been found desirable to provide an increased contact surface area, such as through use of a foil or metal plate placed in contact with the supporting structure.

Dispenser Operation Control Logic

Figure 21B:
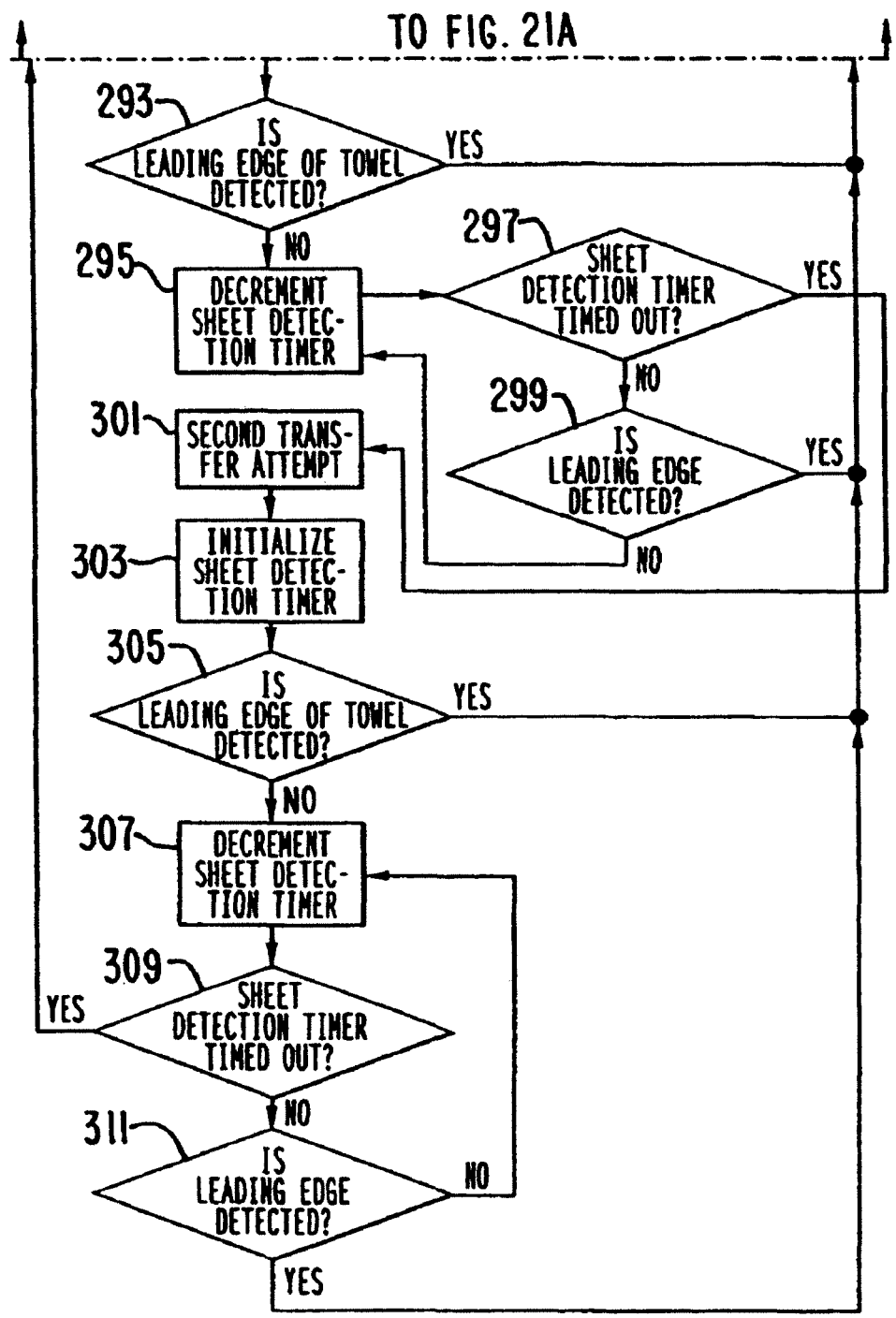

Referring now to FIGS. 21A and 21B, exemplary control logic for operation of towel dispenser 1 is described. Control may begin with the detection of an open cover or towel request, at step 267. If the cover is closed and a sheet request occurs, such as by detection of a hand by proximity sensing system 249, control proceeds to step 269 where it is determined if a towel segment is present in discharge chute 41 (see FIG. 12), that is, if a previously fed towel has not been torn off. If a towel is present, control returns to step 267; control loops between steps 267 and 269 until a towel absent condition is detected. Once a towel absent condition is detected in step 269, control proceeds to step 271 where a sheet detection timer is initialized. If a "sheet hanging" mode is selected, the sheet request check of step 267 is skipped.

In following step 273, feed motor 49 is started in the forward feed direction to attempt a first interval of sheet advancement. Control then proceeds to step 275 where a check is made to see if a leading edge of sheet is detected. As has been described, a leading edge may be determined based upon a transition from a web present to a web absent condition, at either one of sensors 111, 113. Upon detection of a leading edge, a counter associated with sheet displacement sensor 135 is initialized, in step 277. In step 279, feed motor 49 continues to run for a predetermined (second) dispense interval, whereby a leading segment of sheet material is fed out to a position where it may be removed by a user. This may be carried out by counting the number of pulses of displacement detector 135 and comparing the count accumulated (from the initialization of step 277) with a preset count value corresponding to the sheet segment length. In particular, the preset count value is set such that it, together with the amount of sheet displacement that occurs (in step 273) prior to initialization of the sheet displacement detector, provides a total displacement serving to position successive tear lines 19 within discharge chute 41, downstream of the feed mechanism but upstream of the sensors 111, 113. As has been described, the preset count value may be an adjusted count value obtained by subtracting from the desired displacement a predicted "overshoot" of the feed mechanism once the motor is turned off. Although variable, the pre-initialization feed-out of sheet material preferably nominally equals one-half of the distance between the feed mechanism and sensors 111, 113, based upon a target placement of successive tear lines midway between the feed mechanism and sensors 111, 113.

Motor operation is continued in step 279 until the cumulative count value reaches the preset count value. In step 81, sensors 111, 113 are polled to detect removal of the dispensed sheet segment by a user. Control loops at step 281 until removal of the dispensed sheet is detected. Although not illustrated, microprocessor 115 may implement sleep modes to reduce power consumption during prolonged periods of inactivity, as has been described. If removal of the dispensed sheet segment is detected, control flow returns to Start.

If, in step 275, a leading edge of the sheet is not detected, the sheet detection timer initialized in step 271 is decremented, in step 283, and then checked to see if it has timed out, in step 285. So long as the sheet detection timer is not timed out, control proceeds to step 287 where a check for detection of a leading edge is once again carried out. If a leading edge is not detected, control loops back to step 283. If a leading edge is detected, control proceeds to step 277, and thereafter in the manner as has been described.

If, in step 285, the sheet detection timer has timed out, control proceeds to step 289 where a first feed transfer is attempted, by actuation of the feed transfer mechanism. Then, in step 291, the sheet detection timer is reinitialized. Next, in step 293 (FIG. 21B), sensors 111,113 are once again checked to see if a leading edge of towel has been detected. If yes, control returns to step 277 (FIG. 21A) and thereafter proceeds as has been described. If not, the sheet detection timer is decremented, in step 295 and checked to see if it has timed out, in step 297. So long as it has not, control proceeds to step 299 where another check is made for detection of a leading edge. If a leading edge has been detected, this indicates that the first feed transfer attempt was successful, and control returns to step 277 (FIG. 21A). From there, control proceeds as has been described.

If a leading edge is not detected in step 299, control loops back to sheet detection timer decrementing step 295 and time-out detection step 297. If a leading edge is not detected before the sheet detection timer times out, control proceeds to step 301 where a second transfer attempt is carried out, by actuation of the transfer mechanism. Next, in step 303, the sheet detection timer is reinitialized and another check for detection of a leading edge of towel is made, in step 305. Upon detection of a leading edge, control returns to step 277 (FIG. 21A) and proceeds as has been described. If a leading towel edge is not detected in step 305, the sheet detection timer is decremented in step 307 and a check is made in step 309 to see whether the sheet detection timer has timed out. So long as it has not, another check for a leading edge is made in step 311. If a leading edge is detected, control returns to step 277 (FIG. 21A) and thereafter proceeds as has been described. If not, control loops back to step 307 and then step 309. Once it is detected, in step 309, that the sheet detection timer has timed out, the system assumes that the roll material within the dispenser is depleted, or that a malfunction has occurred. Accordingly, control proceeds to step 313 (FIG. 21A) where feed motor 49 is stopped and LED indicator light 153 is blinked.

If a cover-open condition is detected in step 267, this indicates that the dispenser is being serviced, such as by an attendant replenishing the dispenser and setting up the web material for transfer into feed nip 37 (step 315). The program pauses at step 317 until a cover closure is detected, whereupon control proceeds to step 271, and thereafter as has been described.

In the above exemplary control embodiment, upon closure of cover 13 the dispenser waits for a sheet request signal before dispensing a sheet segment. Alternatively, a sheet segment is immediately dispensed upon the cover being closed (whether or not the "sheet hanging" mode is selected). With reference to FIG. 23, an advantage of this system will now be described. If cover 13 of dispenser 1 is opened while a leading sheet segment extends out of the discharge opening, when the cover is again closed a leading portion 319 the leading segment may become lodged between the inside of cover 13 and the bottom side of middle chassis member 9. When this happens, the leading segment may not protrude from the discharge opening sufficiently to be easily grabbed by a user or attendant. By automatically carrying out a dispense operation upon cover closure (notwithstanding that web sensors 111, 113 detect the presence of sheet material), a sufficient amount of sheet material will be advanced out of the dispenser to form a sheet material loop 321 that may readily grasped and pulled-on to free lodged leading portion 319. In addition, an attendant receives immediate feedback indicating that the roll material is properly loaded and the dispenser is operating properly.

Relatedly, the dispense amount of an initial dispense operation following a feed transfer operation is preferably adjusted (decreased) to compensate for the effective shortening of the leading segment resulting from transfer bar 147 (or 200) pressing the leading portion of web 18 into nip 37 (see, e.g., FIGS. 15 and 16B). As seen clearly in FIG. 16C, this action typically will form a folded-over edge portion 323 which is carried around the feed roller and into the discharge chute (41 or 41'). As a result, web sensors 111, 113 will detect the fold-line 325 of folded-over edge portion 323 as the free leading edge segment, and will trigger (at that point) the second predetermined interval of advancement, to dispense the leading sheet segment and properly place the adjacent tear line in the discharge chute (41 or 41'), upstream of sensors 111, 113 and downstream of the feed mechanism. Since the first segment is effectively shortened by the fold-over amount, e.g., 1 inch, the predetermined second interval of advancement is preferably commensurately shortened for this initial cycle, so as to assure proper placement of the adjacent tear line in the discharge chute.

In the above-described control embodiments, a routine may be included to prevent more than a predefined number of sheets from being dispensed within a specified time interval. If more than this predefined number of requests is made, the controller may be programmed to ignore the request until the lapse of a timer. So, for example, if more than three requests are made in a ten second period, the processor can wait until the expiration of the ten second interval or for the expiration of a new ten second interval after the third request. This provides an additional dispenser abuse deterrent.

The present inventions have been described in terms of preferred and exemplary embodiments thereof. Numerous other embodiments, modifications and variations within the scope and spirit of the appended claims will occur to persons of ordinary skill in the art from a review of this disclosure.

The invention claimed is:

1. A dispenser for dispensing flexible sheet material, comprising:
    a support for rotatably supporting a roll of sheet material;
    a feed mechanism for advancing the sheet material from said roll;
    a motor for driving the feed mechanism;
    a plurality of sensors for detecting respective leading edge portions of said sheet material and outputting respective signals indicative thereof;
    a control device for receiving said respective signals and controlling said motor to drive said feed mechanism to dispense a predetermined length of the sheet material from the point at which a leading edge portion is first detected by one of said plurality of sensors; and
    a structure defining a discharge chute downstream of said feed mechanism, and wherein said plurality of sensors are mounted on said structure to detect the presence and absence of sheet material within said discharge chute.

2. The dispenser of claim 1, wherein said plurality of sensors comprise a plurality of optical sensors.

3. The dispenser according to claim 2, wherein said optical sensors are mounted in spaced relation on a printed circuit board extending along a width of said discharge chute.

4. The dispenser according to claim 3, wherein said printed circuit board is snap-fit within a slot providing a passageway through said structure to said discharge chute.

5. A dispenser for dispensing flexible sheet material, comprising:
    a support for rotatably supporting a roll of sheet material;
    a feed mechanism for advancing the sheet material from said roll;

a motor for driving the feed mechanism;

a sensor for detecting a leading edge portion of said sheet material and outputting a signal indicative thereof;

a measurement device for measuring a first interval of advancement of said feed mechanism terminating with a detection of a leading edge portion by said sensor; and a control device for receiving signals from said sensor and said measurement device and for controlling said motor to drive said feed mechanism to dispense a predetermined length of the sheet material from a determined initialization point, said control device comprising:

a storage device for storing a nominal measure of said first interval of advancement;

a comparator for comparing a measurement of said measurement device with said nominal value; and determination means for determining said initialization point for a given dispense cycle based upon an output of said comparator.

6. The dispenser according to claim 5, wherein for a current dispense cycle said determination means selects as said initialization point the point at which said sensor detects a said leading edge, if a difference between a measurement of said measurement device for the current dispense cycle and said nominal value does not exceed a predetermined amount, and selects as said initialization point a point corresponding to said nominal value if said difference exceeds said predetermined value.

7. The dispenser according to claim 6, wherein the nominal value stored in said storage device is calculated based upon measurements made by said measurement device.

8. The dispenser according to claim 7, wherein the nominal value is a moving average of measurements made by said measurement device for past dispense cycles.

9. The dispenser according to claim 5, wherein said measurement device comprises a shaft encoder that counts intervals of displacement of a feed roller of the feed mechanism.

10. A dispenser comprising:

a housing having a discharge opening;

a support within the housing for supporting a continuous strip of sheet material having a plurality of spaced tear lines defining leading and trailing edges of individual removable segments, with an outer segment having a free leading edge and inner segments which in turn become outer segments as adjoining outer segments are removed;

a feed mechanism for repeatedly moving the sheet material in advancement and retraction intervals, said advancement intervals serving to advance successive outer ones of said segments through the discharge opening and out of the housing, said retraction interval serving to initialize the sheet material for said advancement interval;

a sensor for repeatedly detecting arrival of a said leading edge of retracting sheet material at a first position defining the end of said retraction interval and the beginning of said advancement interval, as sheet material is repeatedly retracted back into the discharge opening; and a control device for receiving a signal from the sensor indicating a said arrival of a said leading edge at said first position, and for initiating said advancement interval from said first position, said advancement interval terminating when said leading edge of the sheet material has advanced from said first position a predetermined amount, to repeatedly place said spaced tear lines at a second position that is variable downstream of said first position in relation to variations in the lengths of said segments, said second position defining the beginning of a said retraction interval for a next adjacent segment, when it is in turn initialized for said advancement interval.

* * * * *